United States Patent [19]

Lee et al.

[11] Patent Number: 5,969,552
[45] Date of Patent: Oct. 19, 1999

[54] DUAL LOOP DELAY-LOCKED LOOP

[75] Inventors: Kyeongho Lee, Seoul; Yongsam Moon, Nam-gu Incheon, both of Rep. of Korea; Deog-Kyoon Jeong, Palo Alto, Calif.

[73] Assignee: Silicon Image, Inc., Cupertino, Calif.

[21] Appl. No.: 09/007,707

[22] Filed: Jan. 15, 1998

[51] Int. Cl.$^6$ ........................................ H03K 5/13
[52] U.S. Cl. .................. 327/158; 327/149; 327/161; 327/153; 327/276
[58] Field of Search ........................ 327/149, 158, 327/153, 151, 162, 152, 276; 331/11, 2

[56] References Cited

U.S. PATENT DOCUMENTS

| | | | |
|---|---|---|---|
| 5,101,117 | 3/1992 | Johnson | 327/149 |
| 5,109,394 | 4/1992 | Hjerpe et al. | 375/119 |
| 5,552,726 | 9/1996 | Wichman | 327/149 |
| 5,744,991 | 4/1998 | Jefferson | 327/158 |

FOREIGN PATENT DOCUMENTS 0 704 975 A1  4/1996  European Pat. Off. .

*Primary Examiner*—Timothy P. Callahan
*Assistant Examiner*—April Giles
*Attorney, Agent, or Firm*—Fenwick & West LLP

[57] ABSTRACT

A device and method for synchronizing a local clock to a reference clock. The device uses a frequency acquisition loop and a phase acquisition loop. The frequency acquisition loop delays the reference clock to produce an intermediate clock which falls within the operating range of the phase acquisition loop. The phase acquisition loop then delays the intermediate clock to produce a local clock synchronized to the reference clock.

26 Claims, 27 Drawing Sheets

| INPUT FUP FDOWN BUP BDOWN | OUTPUT | OUTPUT NAME | SITUATION |
|---|---|---|---|
| 1  0  1  0 | UPT = '1'<br>DOWNT = '0' | UP | REF_CLK<br>FCLK/BCLK |
| 0  1  1  0 | UPT = '0'<br>DOWNT = '0' | HOLD | REF_CLK<br>FCLK/BCLK |
| 0  1  0  1 | UPT = '0'<br>DOWNT = '1' | DOWN | REF_CLK<br>FCLK/BCLK |
| 1  0  0  1 | UPT = '1'<br>DOWNT = '1' | REVERSE | REF_CLK<br>FCLK/BCLK |
| OTHERS | UPT = '0'<br>DOWNT = '0' | HOLD | |

FIG. 11

DUAL LOOP DELAY-LOCKED LOOP

BACKGROUND OF THE INVENTION

1. Field of the Invention

This invention relates generally to producing a local clock synchronized in frequency and phase to a reference clock, and more particularly, to producing the local clock by delaying the reference clock.

2. Description of the Related Art

In synchronous systems, the integrated circuits in the system are synchronized to a common reference clock. This synchronization often cannot be achieved simply by distributing a single reference clock to each of the integrated circuits for the following reason, among others. When an integrated circuit receives a reference clock, the circuit often must condition the reference clock before the circuit can use the clock. For example, the circuit may buffer the incoming reference clock or may convert the incoming clock from one voltage level to another. This processing introduces its own delay, with the result that the processed reference clock, which will be referred to as a local clock, often will no longer be adequately synchronized with the incoming reference clock. The trend towards faster system clock speeds flirter aggravates this problem since faster clock speeds reduce the amount of delay, or clock skew, which can be tolerated.

To remedy this problem, an additional circuit is typically used to synchronize the local clock to the reference clock. Two common circuits which are used for this purpose are the phase-locked loop (PLL) and the delay-locked loop (DLL).

In the phase-locked loop, a voltage-controlled oscillator produces the local clock. The phases of the local clock and the reference clock are compared by a phase-frequency detector, with the resulting error signal used to drive the voltage-controlled oscillator via a loop filter. The feedback via the loop filter phase locks the local clock to the reference clock. Stability of the feedback loop, however, depends in part on the loop filter. The electronic characteristics of the loop filter, in turn, often depend significantly on manufacturing parameters. As a result, the same loop filter design may result in a stable feedback loop when manufactured with one process but an unstable loop when manufactured by another. It is difficult to produce a single loop filter design for use with all manufacturing processes, and the design of the loop filter typically must be optimized on a process by process basis.

The delay-locked loop generates a synchronized local clock by delaying the incoming reference clock by an integer number of periods. More specifically, the buffers, voltage level converters, etc. of the integrated circuit introduce a certain amount of delay. The delay-locked loop introduces an additional amount of delay such that the resulting local clock is synchronous with the incoming reference clock. This approach avoids the stability problem inherent in the phase-locked loop approach. Delay-locked loops, however, have a disadvantage of narrow frequency range. The delay-locked loop adjusts the amount of additional delay in order to achieve the desired synchronization, but this adjustment is essentially a phase adjustment. The delay-locked loop lacks any significant frequency adjustment, thus limiting the overall frequency range of conventional delay-locked loops.

Accordingly, there is a need for a device which synchronizes local clocks to reference clocks, is robust to variations in the manufacturing process, and can operate over a wide frequency range.

SUMMARY OF THE INVENTION

In accordance with the present invention, a device for producing a local clock synchronized to a reference clock preferably includes a frequency acquisition loop and a phase acquisition loop. The frequency acquisition loop receives the reference clock and delays the reference clock to produce an intermediate clock which falls within the operating range of the phase acquisition loop. The phase acquisition loop delays the intermediate clock to produce a local clock synchronized to the reference clock. The present invention is particularly advantageous because the architecture described above is robust to manufacturing variations and can accommodate a wide frequency range of reference clocks.

In further accordance with the invention, a method for producing a local clock synchronized to a reference clock comprises the following steps: 1) receiving a reference clock; 2) delaying the reference clock by a first adjustable delay period to produce an intermediate clock; and 3) delaying the intermediate clock by a second adjustable delay period to produce a local clock synchronized to the reference clock.

BRIEF DESCRIPTION OF THE DRAWING

The invention has other advantages and features which will be more readily apparent from the following detailed description of the invention and the appended claims, when taken in conjunction with the accompanying drawing, in which:

FIG. 11 is a logic table illustrating operation of the combinational logic 804 of FIG. 8;

DETAILED DESCRIPTION OF THE PREFERRED EMBODIMENTS

Figure 1:
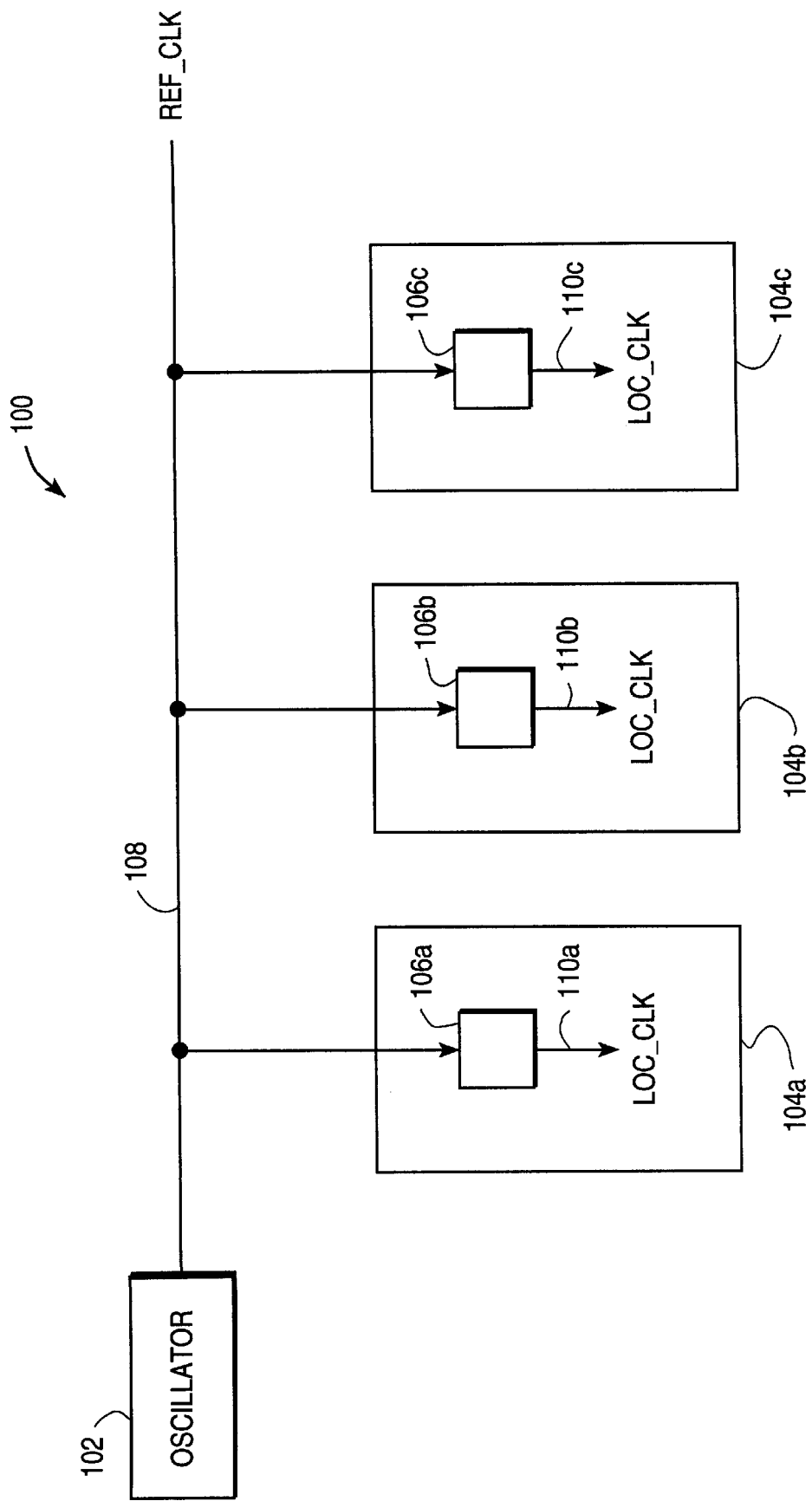
FIG. 1 is a block diagram of a system 100 suitable for use with the present invention.

FIG. 1 is a blocked diagram of a system 100 suitable for use with the present invention. The system 100 includes an oscillator 102 and a number of integrated circuits, three of which 104A, 104B, and 104C, are shown in FIG. 1. Each integrated circuit 104A, 104B, and 104C contains a clock generator 106A, 106B, and 106C. Each integrated circuit 104A–104C is coupled to receive a reference clock (REF_CLK) from the oscillator 102 over signal line 108. Within each integrated circuit 104A–104C, the clock generator 106A–106C receives the reference clock and generates a local clock (LOC_CLK) on lines 110A–110C for use on the integrated circuit.

In order for the system 100 to operate synchronously, each of the local clocks must be synchronized to the reference clock. In other words, the clock generators 106A–106C must ensure that the local clocks generated by them on lines 110A–110C are synchronous with the reference clocks received by them on line 108. Typically, the clock generators 106A–106C will process the incoming reference clocks to make them suitable for use on the integrated circuits 104A–104C. This processing may include functions such as buffering, amplification, or conversion between various voltage levels. The circuits which perform this processing will introduce a delay, or clock skew, to the incoming reference clock. The processed reference clock, therefore, typically will not be synchronized with the incoming reference clock. The clock generators 106A–106C must then also compensate for the clock skews introduced by the processing circuitry.

FIG. 1 depicts the synchronization of separate integrated circuits 104A–104C to a common reference clock. Those of ordinary skill in the art will recognize that the present invention is not limited to the synchronization of integrated circuits. For example, the present invention may be used to synchronize boards or multi-chip modules to one another. Alternately, the present invention may be used in multiple locations on a single integrated circuit in order to synchronize multiple local clocks with the reference clock.

The present invention also is not limited to systems in which multiple local clocks are synchronized to a single reference clock, as depicted in FIG. 1. For example, each local clock may be synchronized to a different reference clock or even to other local clocks.

Figure 2:
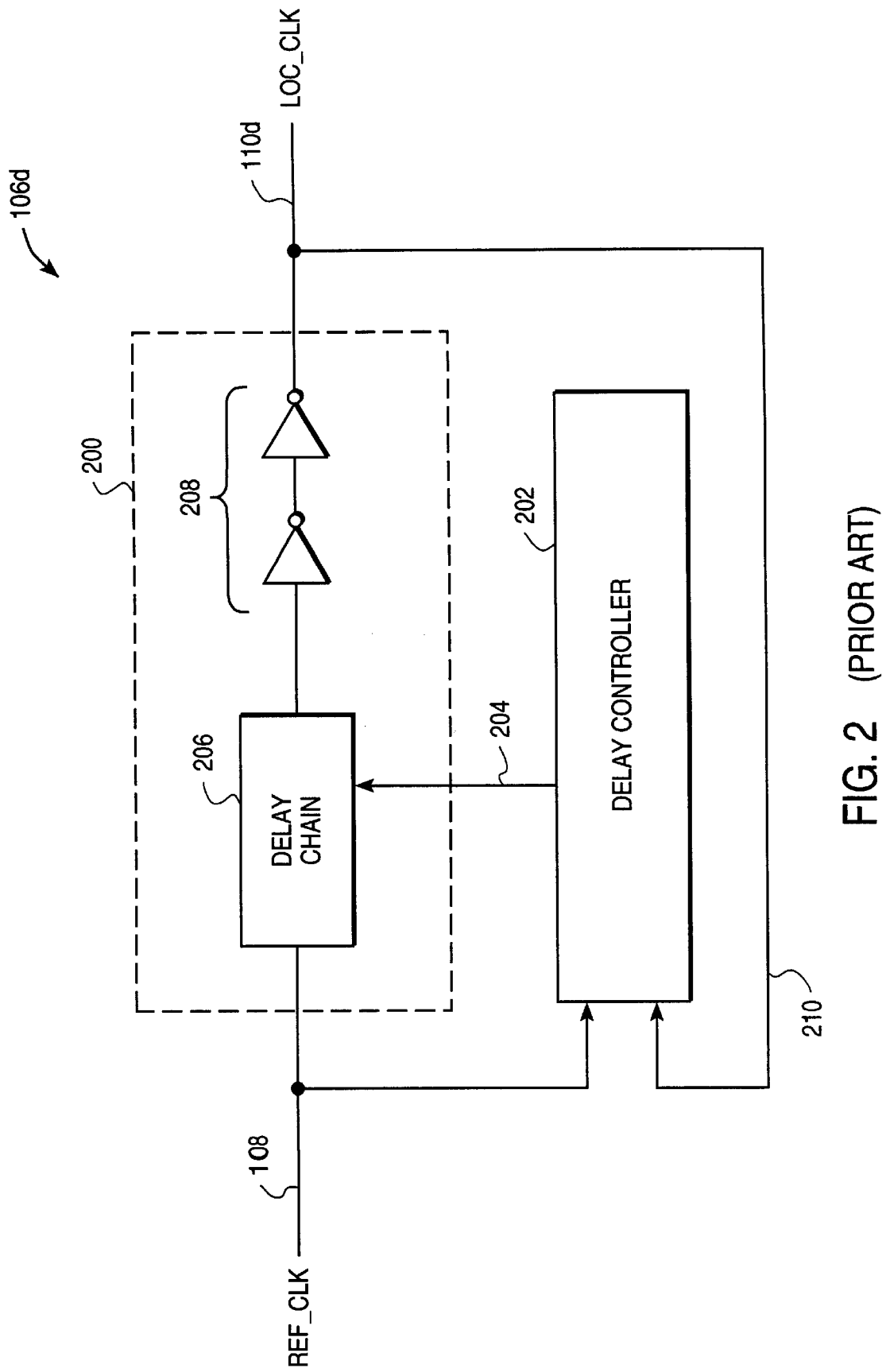
FIG. 2 is a block diagram of a prior art delay-locked loop 106D.

FIG. 2 is a block diagram of a prior art embodiment of a clock generator 106D suitable for use in system 100 of FIG. 1. The embodiment of FIG. 2 is commonly known as a delay-locked loop (DLL). The DLL 106D includes a delay circuit 200 and a delay controller 202. The delay circuit 200 is adapted to receive the reference clock on line 108 and also adapted to output the generated local clock on line 110D. The delay controller 202 is adapted to receive the reference clock on line 108 and coupled to receive the local clock on line 210 as inputs, and coupled to send a delay control signal on line 204 to the delay circuit 200.

The delay circuit 200 further includes a delay chain 206 and processing circuitry 208, which is shown as a series of buffers in FIG. 2. As noted previously, the processing circuitry 208 may perform functions besides buffering but, for convenience, the processing circuitry 208 will be shown as buffers. The delay chain 206 is adapted to receive the reference clock on signal line 108 and coupled to send a delayed version of the reference clock to the processing circuitry 208. The delay chain 206 is also coupled to receive the delay control signal over line 204. The processing circuitry 208 performs the required processing on the received delayed version of the reference clock and then outputs the local clock on line 110D.

The DLL 106D operates as follows. The delay chain 206 receives the reference clock on line 108 and delays the reference clock by a delay period determined by the delay control signal received on line 204. The delayed reference clock is then processed by the processing circuitry 208, resulting in the local clock on line 110D. The local clock is therefore a processed and delayed version of the received reference clock. The local clock will be synchronous with the reference clock if the overall delay introduced by the delay circuit 200 is an integer number of clock periods. In a preferred embodiment, the overall delay is a single clock period.

The delay controller 202 ensures that this condition is met. More specifically, the delay controller 202 receives both the reference clock and the local clock as inputs, on lines 108 and 210, respectively. The delay controller 202 compares the relative phases of the reference and local clocks and produces a delay control signal, which is sent to the delay chain 206 via line 204. The delay control signal adjusts the delay period introduced by the delay chain 206 to reduce any phase mismatch between the reference and local clocks, thus making the delay period introduced by the delay circuit 200 equal to an integer number of periods of the reference clock.

The DLL 106D is more robust to manufacturing variations than would be a phase-locked loop, which is the other common approach to synchronizing reference clocks and local clocks. However, the DLL 106D has a disadvantage of narrow frequency range, which can be understood by referring to FIG. 3. For illustrative purposes, assume that the delay circuit 200 has a maximum delay period of Tmax. Further assume that the DLL 106D initially synchronizes the local clock to the reference clock by setting the delay of the delay circuit 200 to its maximum value Tmax and then adjusting the delay period in response to the relative phases between the reference clock and the generated local clock. Additionally, assume that the DLL 106D synchronizes the rising edges of the reference and local clocks. In other words, the DLL 106D will adjust the delay period so that a rising edge of the local clock will move towards the nearest rising edge of the reference clock, as is typical for many DLLs.

Figure 3:
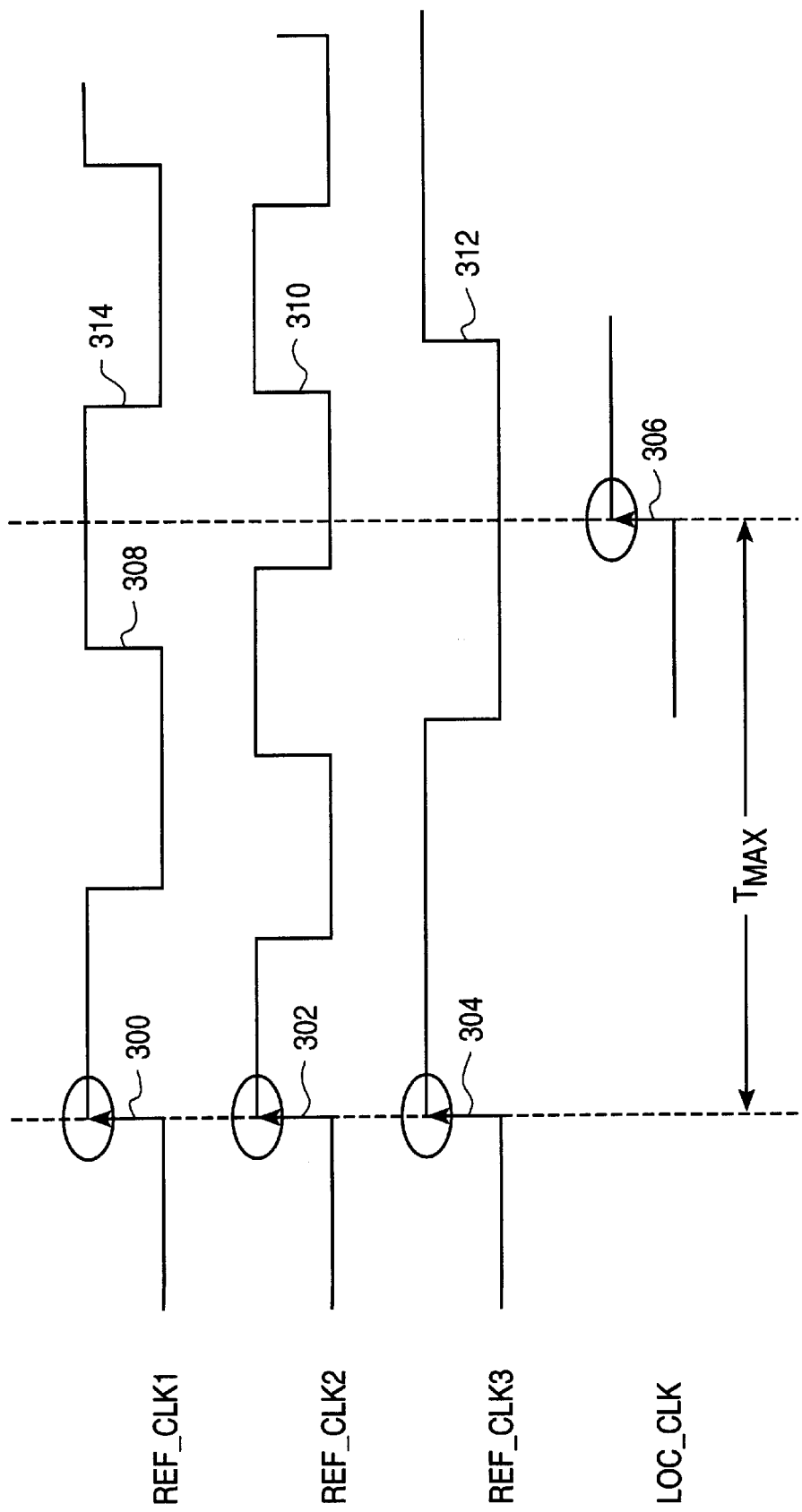
FIG. 3 is a timing diagram illustrating the frequency range of the prior art delay-locked loop 106D of FIG. 2.

FIG. 3 shows the timing diagram for reference clocks of three different periods, labelled as REF_CLK1, REF_

CLK2, and REF_CLK3. For convenience, the rising edges 300, 302, and 304 of these three reference clocks are synchronized in time. If any of these reference clocks is received by the DLL 106D, the DLL 106D will initially produce a local clock with a first rising edge 306 which is delayed by the maximum delay period Tmax. According to the initialization procedure described previously, in the case of reference clock 1, the DLL 106D will attempt to align the leading edge 306 of the local clock with the nearest leading edge 308 of the reference clock 1. To achieve this, the delay introduced by the delay circuit 200 must be reduced. Assuming a most favorable case in which the overall delay can be reduced to 0, the DLL 106D will be able to synchronize the local clock to reference clock 1.

Now consider reference clocks 2 and 3. In these two cases, the nearest leading edge of the reference clocks are edges 310 and 312, respectively. The DLL 106D will attempt to synchronize the local clocks with reference clocks 2 and 3 by synchronizing leading edge 306 with leading edges 310 and 312, respectively. The DLL 106D will attempt to increase the delay period introduced by delay circuit 200 in order to achieve the synchronization. The delay period, however, is already set at its maximum value. Therefore, the DLL 106D will not be able to synchronize the local clock with either reference clock 2 or 3.

In general, in order for the DLL 106D to synchronize the local clock with the reference clock, the leading edge 306 of the local clock must fall between a leading edge 308 and a trailing edge 314 of the reference clock. If the reference clock has period T, then this requirement translates into T<Tmax<1.5 T. Solving for T yields the inequalities $$(\tfrac{2}{3})Tmax < T < Tmax.$$

Inverting the inequalities then yields $$fmax < f < (\tfrac{3}{2})fmax$$

where fmax=1/Tmax and f is the frequency of the reference clock. This equation then defines the frequency operating range of the DLL 106D. Since Tmax, and hence fmax, may vary significantly as a function of the semiconductor manufacturing process, temperature, supply voltage, etc., it is difficult to guarantee the frequency range of the conventional DLL 106D. Hence, it is difficult to guarantee that DLL 106D will be able to synchronize the local clock with the reference clock.

Figure 4:
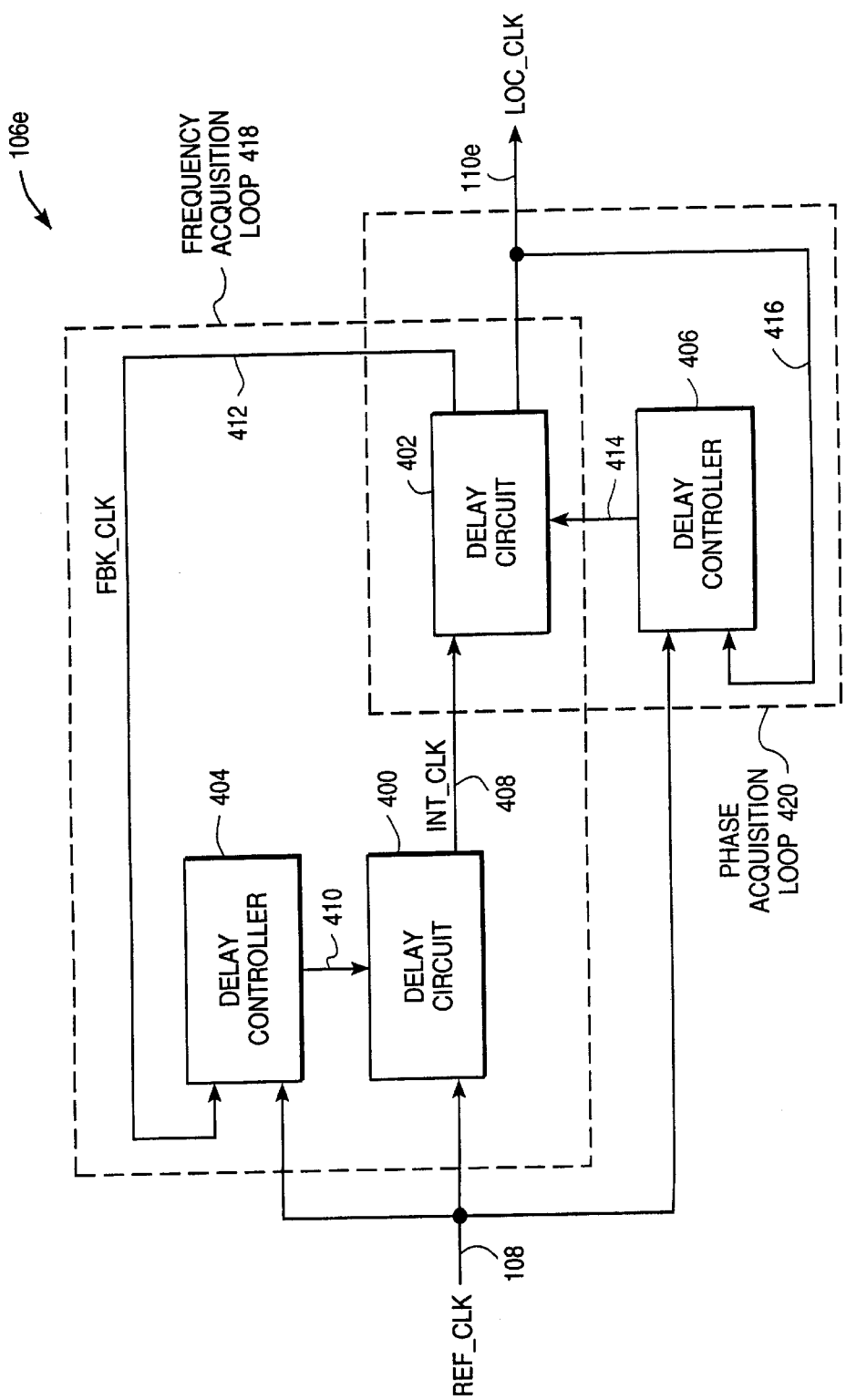
FIG. 4 is a block diagram of one embodiment of a dual loop delay-locked loop 106E in accordance with the present invention.

FIG. 4 is a block diagram of one embodiment of a dual loop delay-locked loop 106E (DLDLL) suitable for use in the system 100 of FIG. 1, in accordance with the present invention. The DLDLL 106E includes two delay circuits 400 and 402 and their respective delay controllers 404 and 406. The first delay circuit 400 is adapted to receive the reference clock on line 108 and also coupled to send an intermediate clock (INT_CLK) to the second delay circuit 402 via line 408. The second delay circuit 402 is adapted to output the local clock on line 110E. The delay controller 404 for delay circuit 400 is coupled to send a delay control signal to delay circuit 400 on line 410. The delay controller 404 is also adapted to receive the reference clock on line 108 and coupled to receive a feedback clock (FBK_CLK) from delay circuit 402 on line 412. Similarly, the delay controller 406 for delay circuit 402 is coupled to send a delay control signal to delay circuit 402 on line 414. The controller 406 is also adapted to receive the reference clock on line 108 and coupled to receive the local clock on line 416.

The DLDLL 106E can be divided into two feedback loops 418 and 420. The frequency acquisition loop 418 includes the delay circuit 400, its corresponding controller 404, and the delay circuit 402; while includes the delay circuit 402 and its corresponding controller 406. The frequency acquisition loop 418 is adapted to receive the reference clock on line 108 and coupled to send an intermediate clock to the phase acquisition loop 420 via line 408. The phase acquisition loop 420 is coupled to receive the intermediate clock on line 408 and adapted to receive the reference clock on line 108, and adapted to output the local clock on line 110E. Note that in this embodiment, the delay circuit 402 is part of both the frequency acquisition loop 418 and the phase acquisition loop 420.

Operation of the DLDLL 106E may be understood by considering each of the loops 420 and 418 in turn. The phase acquisition loop 420 receives the intermediate clock on line 408. The delay circuit 402 delays the intermediate clock on line 408 to produce the local clock on line 110E. The delay controller 406 compares the reference clock on line 108 with the local clock on line 416 to produce a delay control signal on line 414, which adjusts the delay period introduced by the delay circuit 402. In this way, the local clock on line 110E is synchronized to the reference clock on line 108. The phase acquisition loop 420 operating on its own, however, would suffer from the narrow frequency operating range discussed previously in connection with the conventional DLL 106D of FIG. 2.

The frequency acquisition loop 418 addresses the problem of limited operating range. The frequency acquisition loop 418 receives the reference clock on line 108 and delays it to produce the intermediate clock on line 408. The delay introduced by the frequency acquisition loop 418 is chosen so that the intermediate clock on line 408 falls within the operating range of the phase acquisition loop 420. Thus, the operating range of the DLDLL 106E is much broader than that of the phase acquisition loop 420 alone. More specifically, the intermediate clock on line 408 is delayed by the delay circuit 402 to produce the feedback clock on line 412. The feedback clock is compared with the reference clock on line 108 by the delay controller 404. In a preferred embodiment, the controller 404 compares the relative phases of the reference and feedback clocks. The delay controller 404 sends a delay control signal on line 410 to adjust the delay period introduced by the delay circuit 400, thus ensuring that the intermediate clock on line 408 falls within the operating range of the phase acquisition loop 420.

Since the DLDLL 106E is based on delaying the incoming reference clock to produce a synchronized local clock, the DLDLL 106E retains the advantage of robustness to manufacturing variations which was characteristic of the conventional DLL 106D of FIG. 2. However, since the DLDLL 106E includes the frequency acquisition loop 418, the DLDLL 106E has an additional advantage of much wider frequency range than the conventional DLL 106D.

Figure 5:
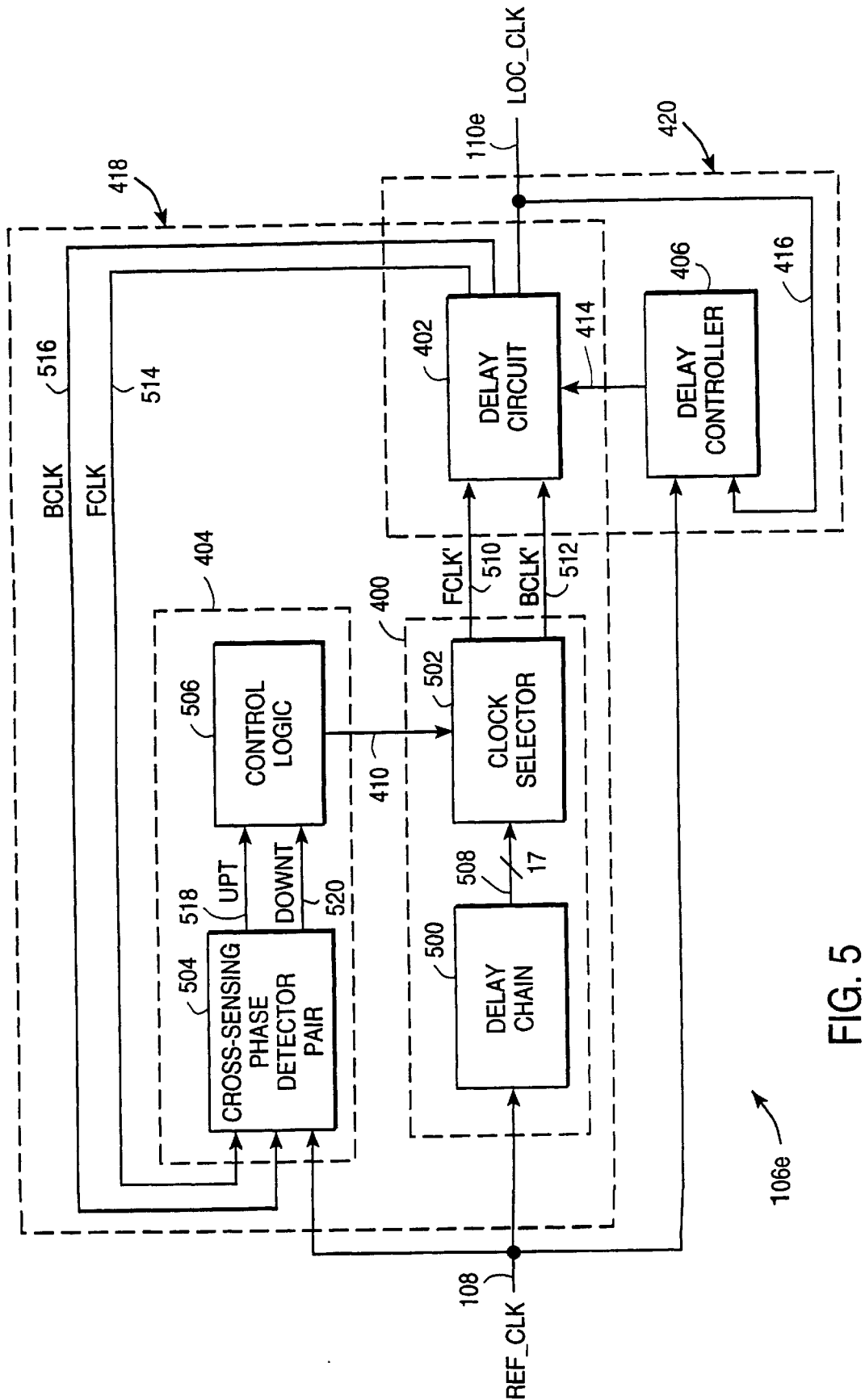
FIG. 5 is a block diagram of a preferred embodiment of the dual loop delay-locked loop 106E of FIG. 4.

FIG. 5 is a block diagram of a preferred embodiment of the DLDLL 106E of FIG. 4. In this embodiment, the delay circuit 400 includes a delay chain 500 and a clock selector 502. The delay controller 404 includes a cross-sensing phase detector pair 504 and a control logic 506. The DLDLL 106E also includes a delay circuit 402 and delay controller 406, as in FIG. 4.

The frequency acquisition loop 418 is coupled as follows. The delay chain 500 is adapted to receive the reference clock on line 108 and coupled to send a number of delayed clocks in parallel over line 508 to the clock selector 502. In this embodiment, seventeen delayed clocks are used, although the present invention is not limited to this specific number. The clock selector 502 is coupled to send the intermediate clock to the delay circuit 402. However, in this embodiment, the intermediate clock consists of two separate clocks, which are labeled as F-clock (FCLK') on line 510 and B-clock (BCLK') on line 512. The delay circuit 402 is coupled to send a feedback clock to the cross-sensing phase detector pair 504. However, as with the intermediate clock, the feedback clock includes two clocks: a feedback F-clock (FCLK) on line 514 and a feedback B-clock (BCLK) on line 516. The cross-sensing phase detector pair 504 receives both feedback clocks and is also adapted to receive the reference clock on line 108. It is also coupled to send up tick (UPT) and down tick (DOWNT) signals on lines 518 and 520, respectively, to the control logic 506. The control logic is coupled to send a delay control signal on line 410 to the clock selector 502. The couplings of the phase acquisition loop 420 are the same as in FIG. 4, except that the intermediate clock now consist of two separate clocks. More specifically, the delay circuit 402 is coupled to receive the F- and B- clocks on lines 510 and 512, respectively, and is also adapted to output the local clock on line 110E. The delay controller 406 is coupled to receive the local clock on line 416 and adapted to receive the reference clock on line 108. The controller 406 sends a delay control signal on line 414 to the delay circuit 402.

Figure 6:
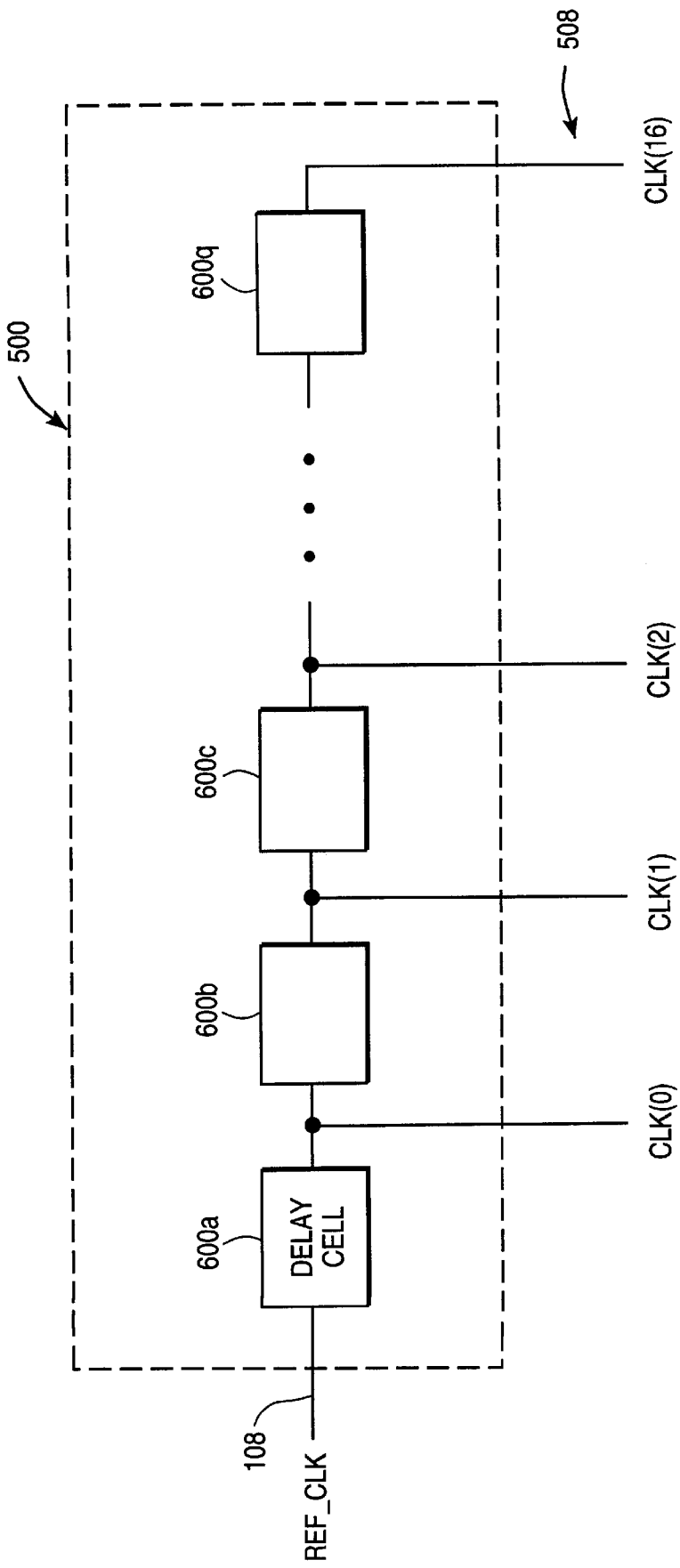
FIG. 6 is a block diagram of a preferred embodiment of the delay chain 500 of FIG. 5.

FIG. 6 is a block diagram of a preferred embodiment of the delay chain 500 of FIG. 5. The delay chain 500 consist of seventeen delay cells 600A–600Q connected in series. The first delay cell 600A is adapted to receive a reference clock on line 108 and each subsequent cell 600B–600Q is coupled to receive the output of the previous cell. Each delay cell 600A–600Q introduces an identical, fixed amount of delay. The delay chain 500 is tapped after each delay cell 600A–600Q producing the seventeen delayed clocks CLK(0), CLK(1), . . . CLK(16). The delayed clocks are coupled to the clock selector 502 via line 508.

Figure 7A:
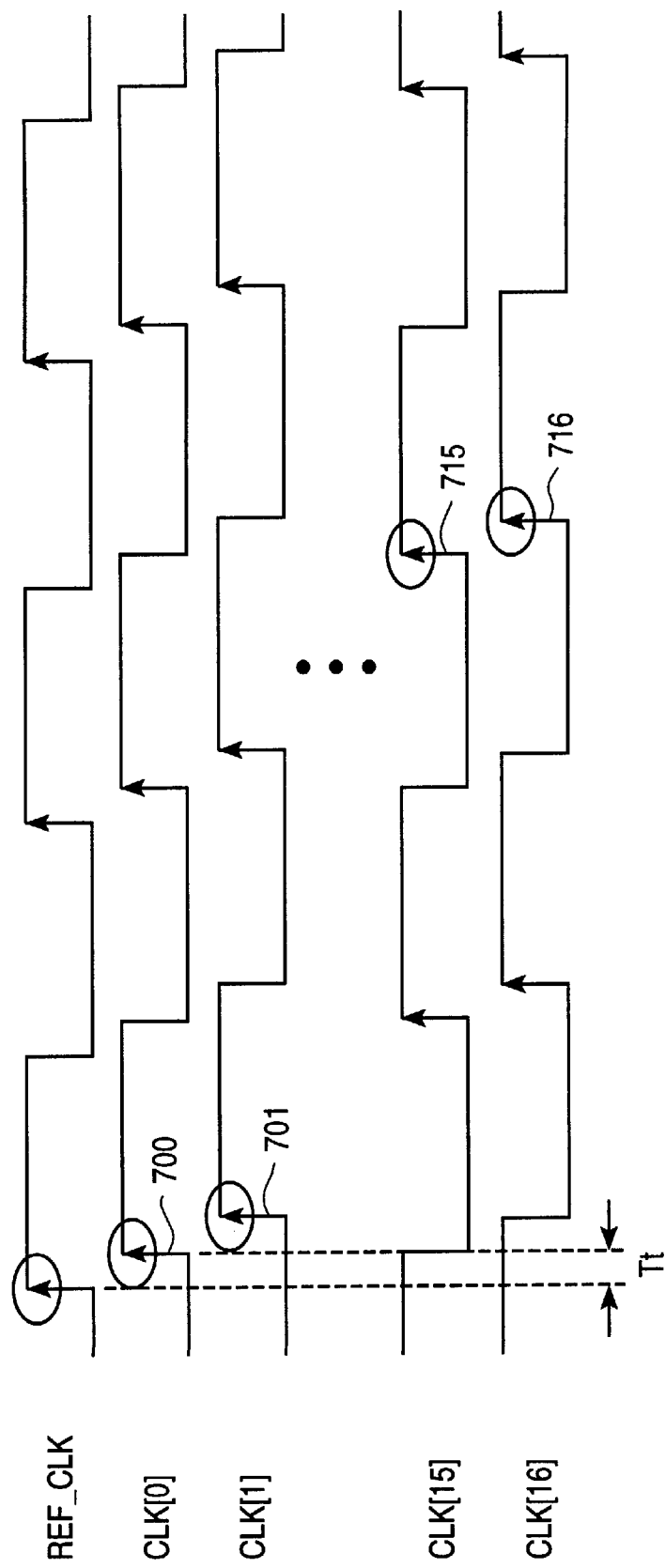
FIGS. 7A–7C are timing diagrams illustrating operation of the frequency acquisition loop 418 of FIG. 5.

FIG. 7A is a timing diagram which illustrates operation of the delay chain 500 of FIG. 6. Delay cell 600A delays the reference clock by amount Tt, producing delayed clock CLK(0); delay cell 600B delays CLK(0) by amount Tt, producing delayed clock CLK(1); and so forth. The result is a series of delayed clocks CLK(0)-CLK(16) with leading edges 700–716 which are regularly spaced in time. For clarity, clocks such as CLK(0)–CLK(16) will often be represented in timing diagrams by a single arrow representing the leading edge of the waveform rather than by the complete waveform. For example, CLK(0) may be represented by the leading edge arrow 700 rather than the complete waveform. In addition, although the following embodiments will be described with respect to leading edges, the present invention may utilize other reference edges, such as trailing edges.

Figure 7B:
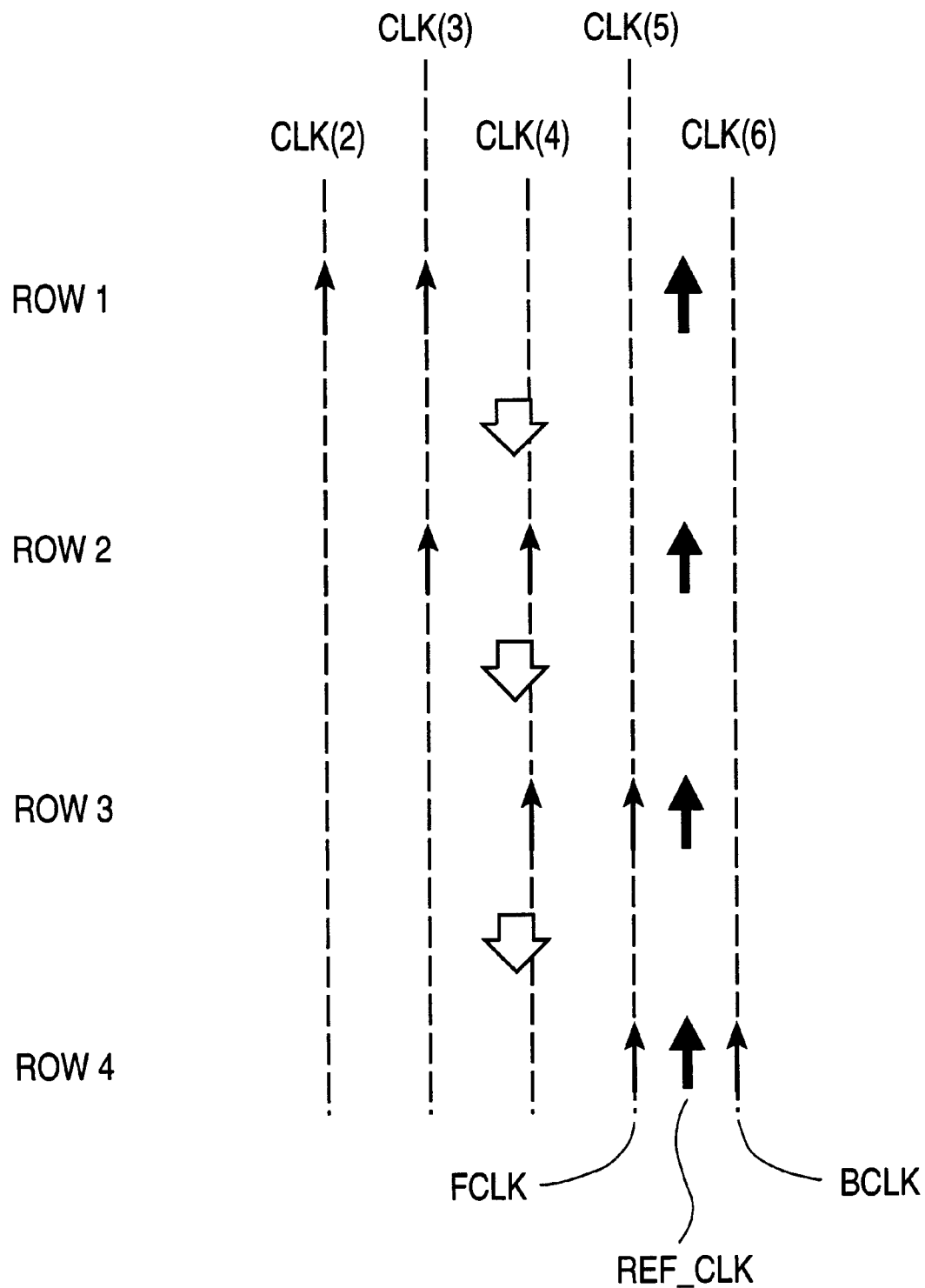
Figure 7C:
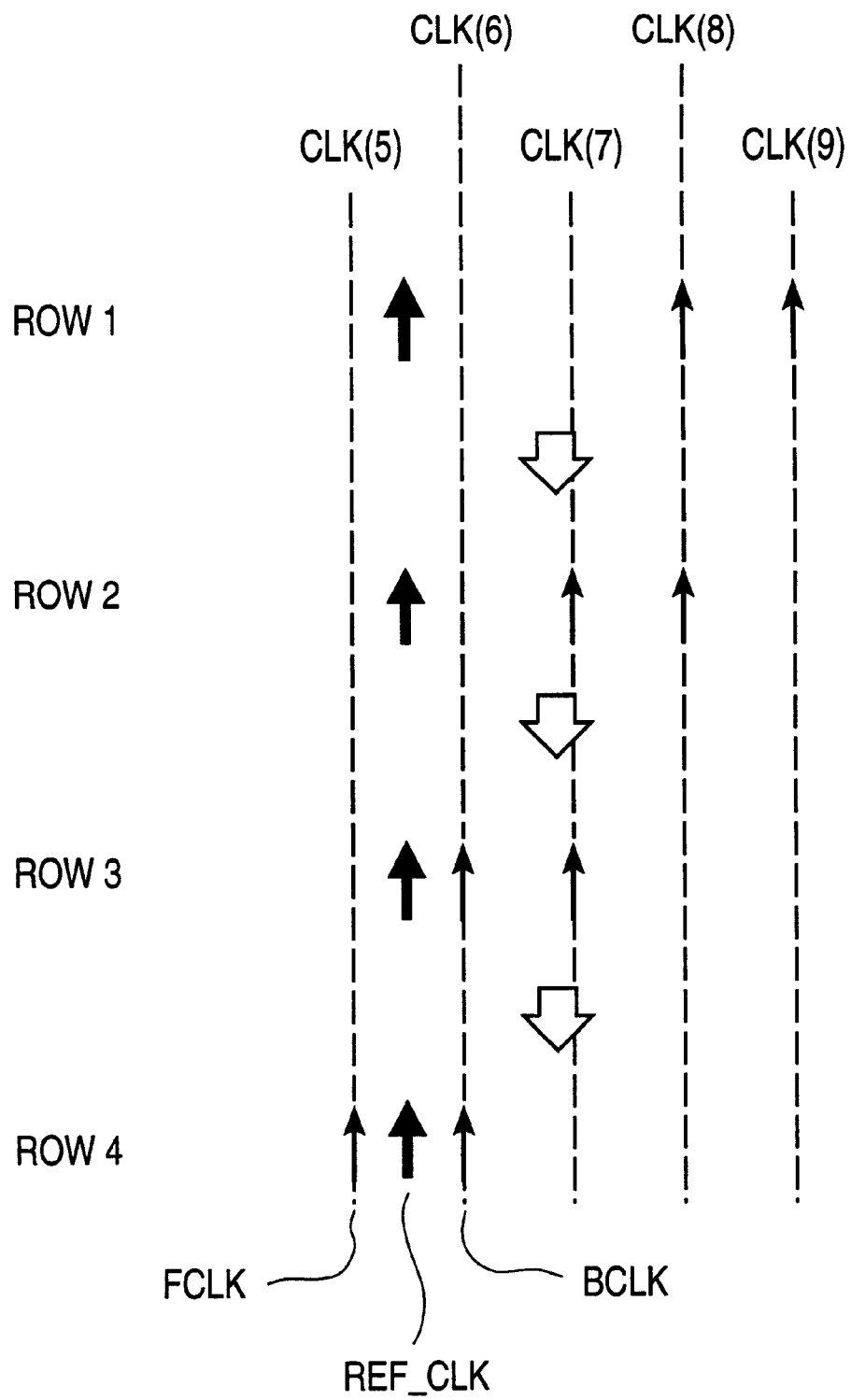

Operation of the remainder of frequency acquisition loop 418 of FIGS. 5 and 6 may be understood with reference to the timing diagrams of FIGS. 7B and 7C. The clock selector 502 selects two adjacent delayed clocks to become the F- and B-clocks. The delay circuit 402 then delays both of these clocks by equal amounts to produce the feedback F- and B-clocks. The frequency acquisition loop 418 selects the two clocks from CLK(0)–CLK(16) which result in feedback F- and B-clocks which flank the reference clock, as shown in Row 4 of FIGS. 7B and 7C. In other words, the frequency acquisition loop 418 selects the F- and B-clocks so that the feedback F-clock leads the reference clock while the feedback B-clock lags the reference clock. If the reference clock is between the feedback F- and B-clocks, then the intermediate clock, which consists of the F- and B-clock, will fall within the operating range of the phase acquisition loop 420.

FIG. 7B illustrates a case in which the feedback clocks are initially both leading the reference clock. In this figure, the rising edges of the feedback clock are represented by arrows of normal thickness, while the reference clock is represented by a heavy arrow. The label CLK(n) indicates that the corresponding feedback clock is based on CLK(n). In Row 1, the initial feedback clocks are based on CLK(2) and CLK(3), while the desired feedback clocks are based on CLK(5) and CLK(6), as shown in Row 4. Via its feedback loop, the frequency acquisition loop 418 walks the feedback F- and B-clocks from their initial state based on CLK(2) and CLK(3) to a state based on CLK(3) and CLK(4) as shown in Row 2, then to a state based on CLK(4) and CLK(5) as shown in Row 3, and finally to the state based on CLK(5) and CLK(6) as shown in Row 4. The frequency acquisition loops 418 then locks the feedback clocks to this state.

FIG. 7C illustrates a case in which the feedback F- and B-clocks are initially lagging the reference clock. In this case, the feedback clocks are initially based on CLK(8) and CLK(9) as shown in Row 1 but, analogous to the situation in FIG. 7B, the frequency acquisition loop walks the feedback clocks forward in time until they are based on CLK(5) and CLK(6), thus flanking the reference clock as shown in Row 4 of FIG. 7C.

The delay chain 500 provides a coarse adjustment of the overall delay introduced by DLDLL 106E, by introducing a delay which is an integer multiple of Tt. The delay circuit 402 then provides a fine adjustment of the overall delay. If the delay circuit 402 introduces a delay ranging from Tmin to Tmax, then selecting Tt<Tmax−Tmin ensures that the overall delay introduced will be continuously adjustable over a wide range, thus significantly increasing the frequency operating range of DLDLL 106E. More specifically, the DLDLL 106E will be able to adjust the overall delay over a range of approximately N*Tt, where N is the number of delay cells 600A–600Q. In comparison, the conventional DLL 106D can only adjust the overall delay over a range of approximately (Tmax−Tmin). Since Tt is typically similar in value to (Tmax−Tmin), the DLDLL 106E has a significantly wider frequency operating range than the conventional DLL 106D.

Figure 8:
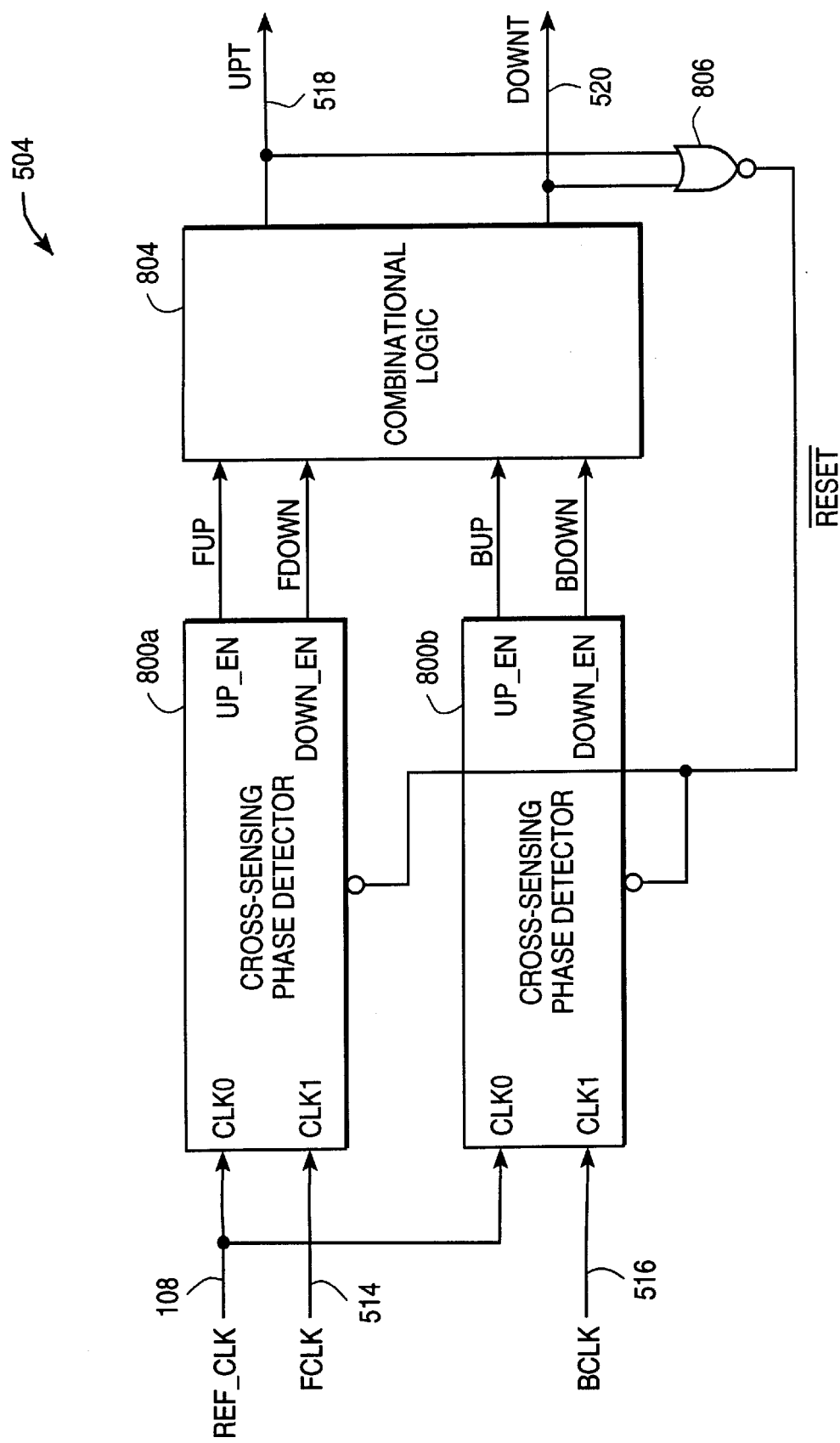
FIG. 8 is a block diagram of a preferred embodiment of the cross-sensing phase detector pair 504 of FIG. 5.

FIG. 8 is a block diagram of a preferred embodiment of the cross-sensing phase detector pair 504 of FIG. 5. The cross-sensing phase detector pair 504 includes two cross-sensing phase detectors 800A and 800B, and combinational logic 804. The first cross-sensing phase detector 800A is adapted to receive the reference clock on line 108 and coupled to receive the feedback F-clock on line 514. Similarly, the second cross-sensing phase detector 800B is adapted to receive the reference clock on line 108 and coupled to receive the feedback B-clock on line 516. Both cross-sensing phase detectors 800A and 800B are coupled to send an up signal (FUP or BUP) and a down signal (FDOWN or BDOWN) to the combinational logic 804, which is coupled to send an up tick and a down tick to the control logic 506 on lines 518 and 520, respectively. The up tick and down tick signals are also sent to NOR gate 806 to produce a reset signal for both cross-sensing phase detectors 800A and 800B.

Figure 9:
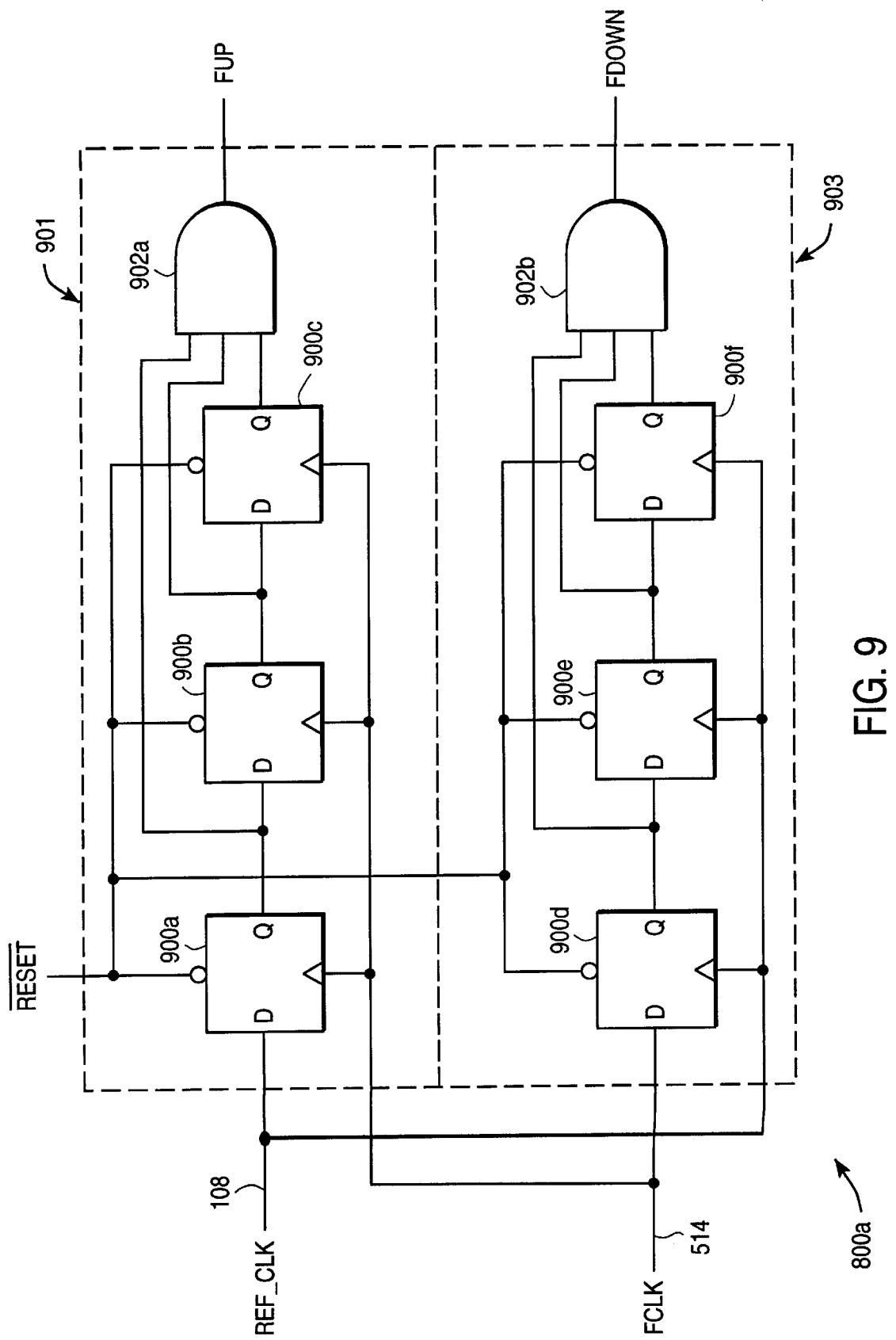
FIG. 9 is a block diagram of a preferred embodiment of the cross-sensing phase detector 800A of FIG. 8.

FIG. 9 is a block diagram of a preferred embodiment of the cross-sensing phase detector 800A of FIG. 8. The cross-sensing phase detector 800A includes a signal path 901 to produce an up signal and a path 903 to produce a down signal. The up signal path 901 includes three latches 900A, 900B, and 900C connected in series, and a three-input AND gate 902A. The first latch 900A in the series is adapted to receive the reference clock and the feedback F-clock is coupled to clock each of the three latches 900A–900C. The outputs of the three latches 900A–900C are coupled to the AND gate 902A, which produces the up signal at its output.

The down signal path 903 is similar to the up signal path 901, except that the roles of reference clock and feedback F-clock are reversed. More specifically, the signal path 903 consists of three latches 900D, 900E, and 900F, and a three-input AND gate 902B. The latches 900D–900F are connected in series with their outputs coupled to the input of the AND gate 902B, with the output of the AND gate 902B being the down signal. The first latch 900D is coupled to receive the feedback F-signal on line 514, and the reference clock on line 108 is used to clock the three latches 900D–900F.

The cross-sensing phase detector 800A is cross-sensing since, in one signal path, the reference clock senses the feedback F-clock; while in the other path, the feedback F-clock senses the reference clock. The reset signal received by cross-sensing phase detector 800A is sent to the latches 900A–900F. In a preferred embodiment, an identical circuit is used for the cross-sensing phase detector 800B of FIG. 8.

Figure 10A:
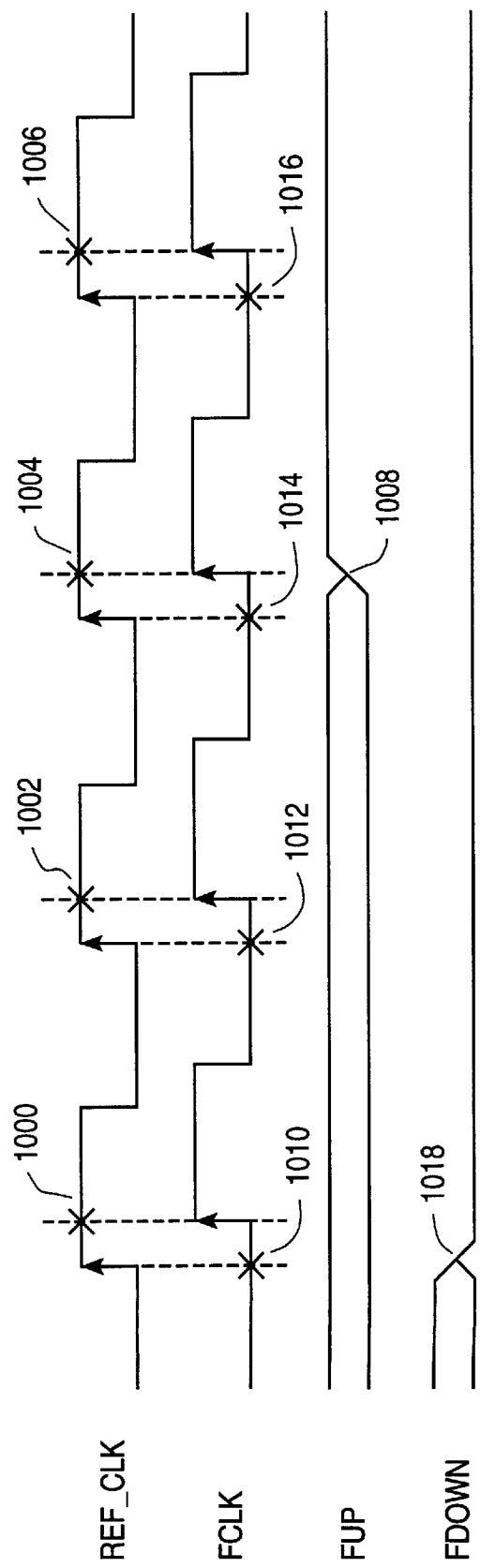
FIGS. 10A and 10B are timing diagrams illustrating operation of the cross-sensing phase detector 800 of FIG. 9.
Figure 10B:
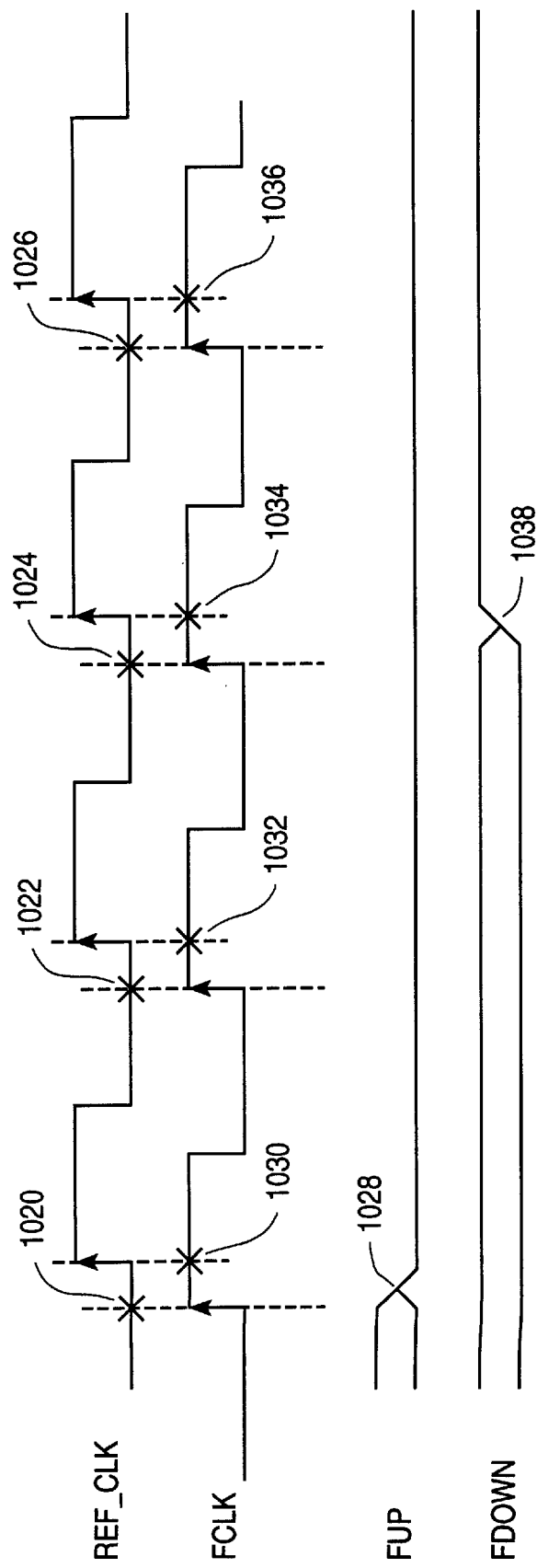

FIGS. 10A and 10B are timing diagrams illustrating operation of the cross-sensing phase detector 800A of FIG. 9. FIG. 10A illustrates the case when the feedback F-clock lags the reference clock. In the up signal path 901, the feedback F-clock clocks the latches 900A–900C. Therefore, the value latched will be the value of the reference clock at the leading edge of the feedback F-clock, as denoted by the X's 1000, 1002, 1004, and 1006 in FIG. 10A. Since the reference clock is leading the feedback F-clock, the values latched into the latches 900A–900C will be binary 1's. As a result of the AND gate 902A, however, the up signal will not be asserted 1008 until three consecutive 1's have been latched. In contrast, the down signal path 903 will latch in 0's as indicated by the X's 1010, 1012, 1014 and 1016. As a result of the AND gate 902B, the down signal will be deactivated 1018 as soon as the first 0 1010 is latched.

FIG. 10B illustrates the case in which the reference clock lags the feedback F-clock. The up signal path 901 latches in the 0's 1020, 1022, 1024 and 1026, and the up signal is deactivated 1028 as soon as the first 0 1020 is latched into the signal path 901. The down signal path 903 latches the 1's 1030, 1032, 1034, and 1036, but the down signal itself is not asserted 1038 until three consecutive 1's have been latched.

Operation of the cross-sensing phase detector 800A may be summarized as follows. The up signal is asserted if the reference clock leads the feedback F-clock for three consecutive periods and is deactivated if the reference clock lags the feedback F-clock for a single period. Analogously, the down signal is asserted if the reference clock lags the feedback F-clock for three consecutive periods and is deactivated as soon as the reference clock leads the feedback F-clock. The cross-sensing phase detector 800B operates in the same fashion, but with respect to the feedback B-clock rather than the feedback F-clock.

Those of ordinary skill in the art will recognize that phase detectors other than the cross-sensing phase detector pair 504 may be used, as well as lead/lag signals other than the UPT and DOWNT signals on lines 578 and 520.

FIG. 11 is a logic table illustrating operation of the combinational logic 804 of FIG. 8. As shown in FIG. 8, the combinational logic 804 receives up and down signals from each of the cross-sensing phase detectors 800A and 800B. In FIG. 11, the signals from the cross-sensing phase detector 800A are labeled FUP and FDOWN; while the signals from cross-sensing phase detector 800B are labeled BUP and BDOWN. The combinational logic 804 transforms the inputs FUP, FDOWN, BUP, and BDOWN into the two outputs UPT and DOWNT on lines 518 and 520, according to the table in FIG. 11.

The various combinations of UPT and DOWNT are also given names as indicated in FIG. 11. An "UP" output means that both the feedback F- and B-clocks lag the reference clock, as illustrated in the last column of FIG. 11. In this situation, the feedback clocks will be moved forward in time as previously illustrated in FIG. 7B. A "DOWN" output corresponds to the opposite situation in which both feedback clocks lead the reference clock, so that both clocks will be moved backward in time as illustrated in FIG. 7A. The "HOLD" output may correspond to the desired situation in which the reference clock leads the feedback B-clock but lags the feedback F-clock. In this case, no motion of the feedback clocks is required. "HOLD" may also correspond to other combinations of inputs, as indicated in the last row of FIG. 11. This might occur, for example, if noise in the system causes temporary deviations from the desired state. In this case, no change in the feedback clocks is warranted until the reference clock has been either leading or lagging both feedback clocks for at least three consecutive periods. The requirement of three consecutive periods is a result of the series of three latches 900A–900C and 900D–900F. In alternative embodiments, numbers other than three may be used. The final output "REVERSE" means that the trailing edge of the reference clock is between the leading edges of the feedback F- and B-clocks. Since this is not a desired state, it is important to escape successfully from this condition, as will be explained below.

Figure 12:
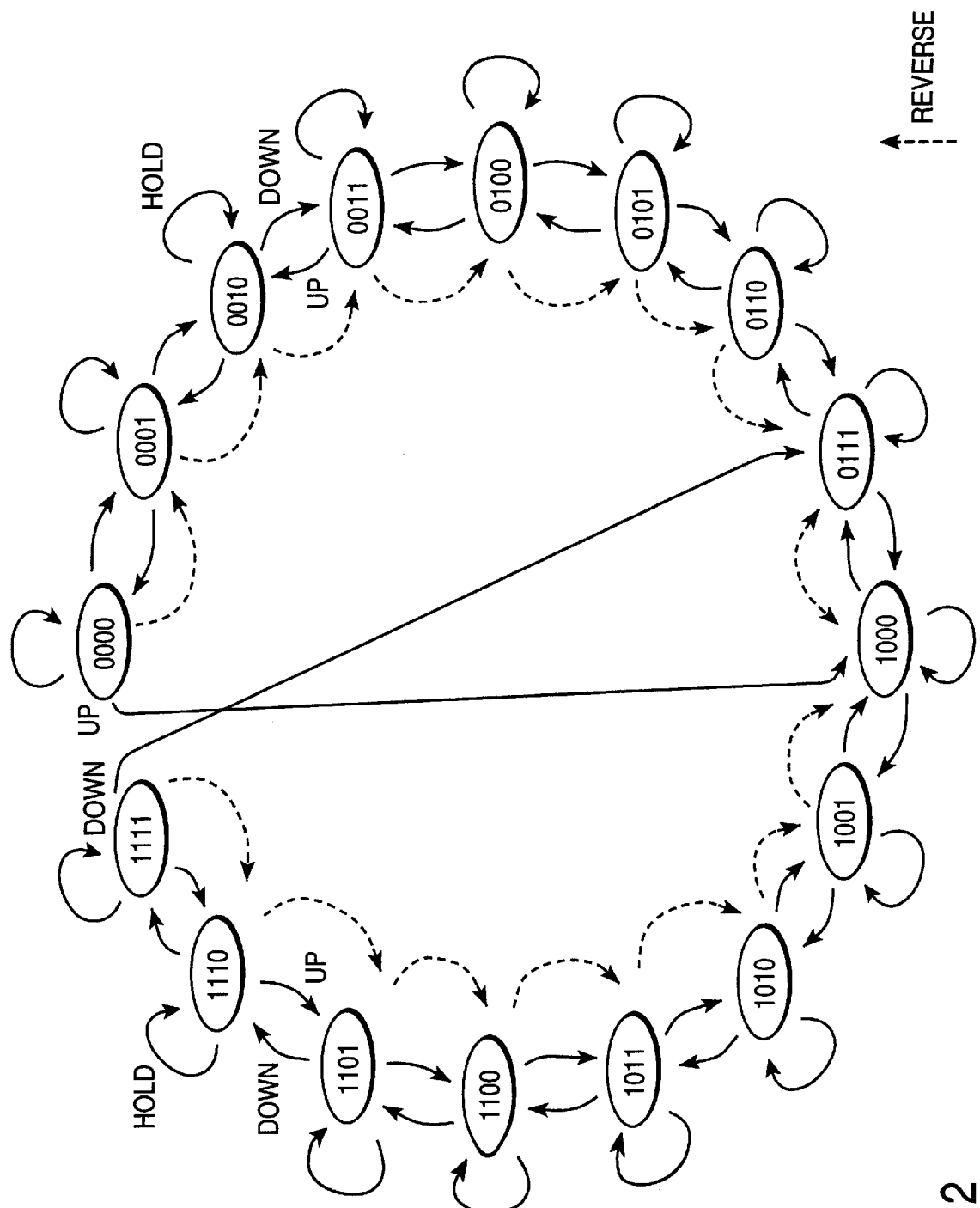
FIG. 12 is a state diagram illustrating operation of the control logic 506 of FIG. 5.

FIG. 12 is a state diagram illustrating operation of the control logic 506 of FIG. 5. The sixteen states are represented by the ovals with the binary digits 0000 to 1111. Each of the states corresponds to a specific selection of the delayed clocks CLK(0)–CLK(16) for the F- and B-clock. In state 0000, CLK(0) is selected as the F-clock and CLK(1) as the B-clock; in state 0001, CLK(1) is selected as the F-clock and CLK(2) as the B-clock; and so forth. The control logic 506 changes the state in response to the output from the combinational logic 804. If the control logic 506 receives HOLD, then the state remains unchanged. If the control logic 506 receives DOWN, then the binary state is increased by one, thus increasing the delay of both feedback signals. However, if the state is already 1111 and cannot be increased, then the state is changed to 0111 instead. Similarly, if the control logic 504 receives UP, then the state is decreased by one. Again, if the state is already 0000 and cannot be decreased, then the state is changed to 1000. Finally, if the control logic 504 receives REVERSE, then the state is increased if the most significant bit of the current state is 0 and decreased if the most significant bit is 1.

Figure 13A:
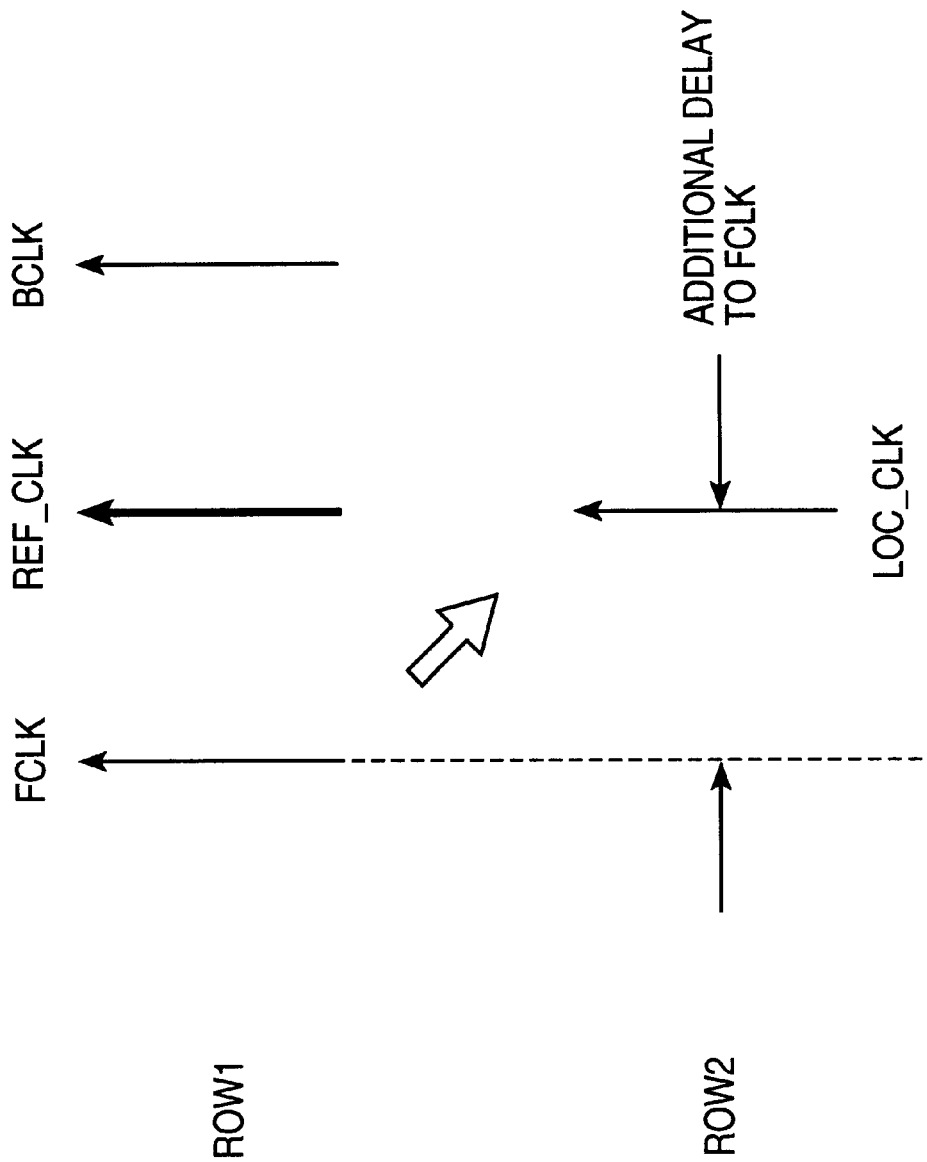
FIGS. 13A and 13B are timing diagrams illustrating two alternate methods of operation of the phase acquisition loop 420 of FIG. 5.
Figure 13B:
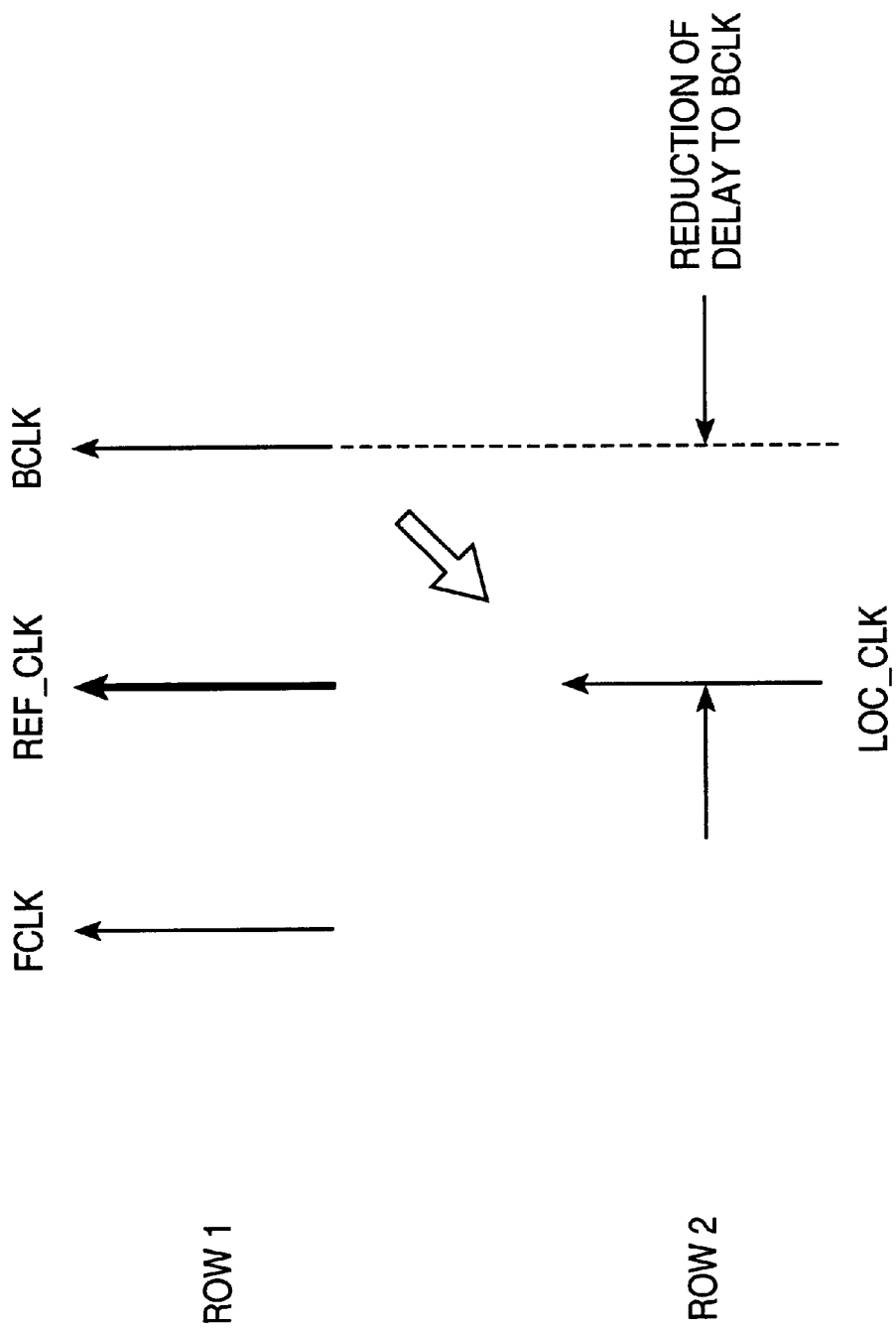

FIGS. 13A and 13B are tiling diagrams illustrating two alternate methods of operation of the phase acquisition loop 420 of FIG. 5. For convenience, the method of FIG. 13A will be referred to as Type 1; while the method of FIG. 13B will be referred to as Type 2. Referring to FIG. 5, the phase acquisition loop 420 receives a F-clock and a B-clock on lines 510 and 512 from the frequency acquisition loop 418. The delay circuit 402 delays both the F- and B-clocks by equal amounts to produce the feedback F- and B-clocks on lines 514 and 516. As shown in Row 1 of both FIGS. 13A and 13B, the F- and B-clocks are chosen by the frequency acquisition loop 418 such that the reference clock is flanked by the feedback F- and B-clocks. The phase acquisition loop 420 receives the F- and B-clocks and produces a local clock on line 110E which is synchronized to the reference clock online 108. In the Type 1 approach of FIG. 13A, the local clock is produced by delaying the incoming F-clock. More specifically, the incoming F-clock experiences a delay which is greater than that required to produce the feedback clocks. Hence, the local clock falls between the two feedback clocks and may be synchronized to the reference clock, as illustrated in Row 2 of FIG. 13A. In the Type 2 approach of FIG. 13B, the local clock is produced by delaying the B-clock. More specifically, the incoming B-clock experiences a delay which is less than that required to produce the feedback clocks. Hence, the local clock may be synchronized to the reference clock, as shown in FIG. 13B.

Figure 14:
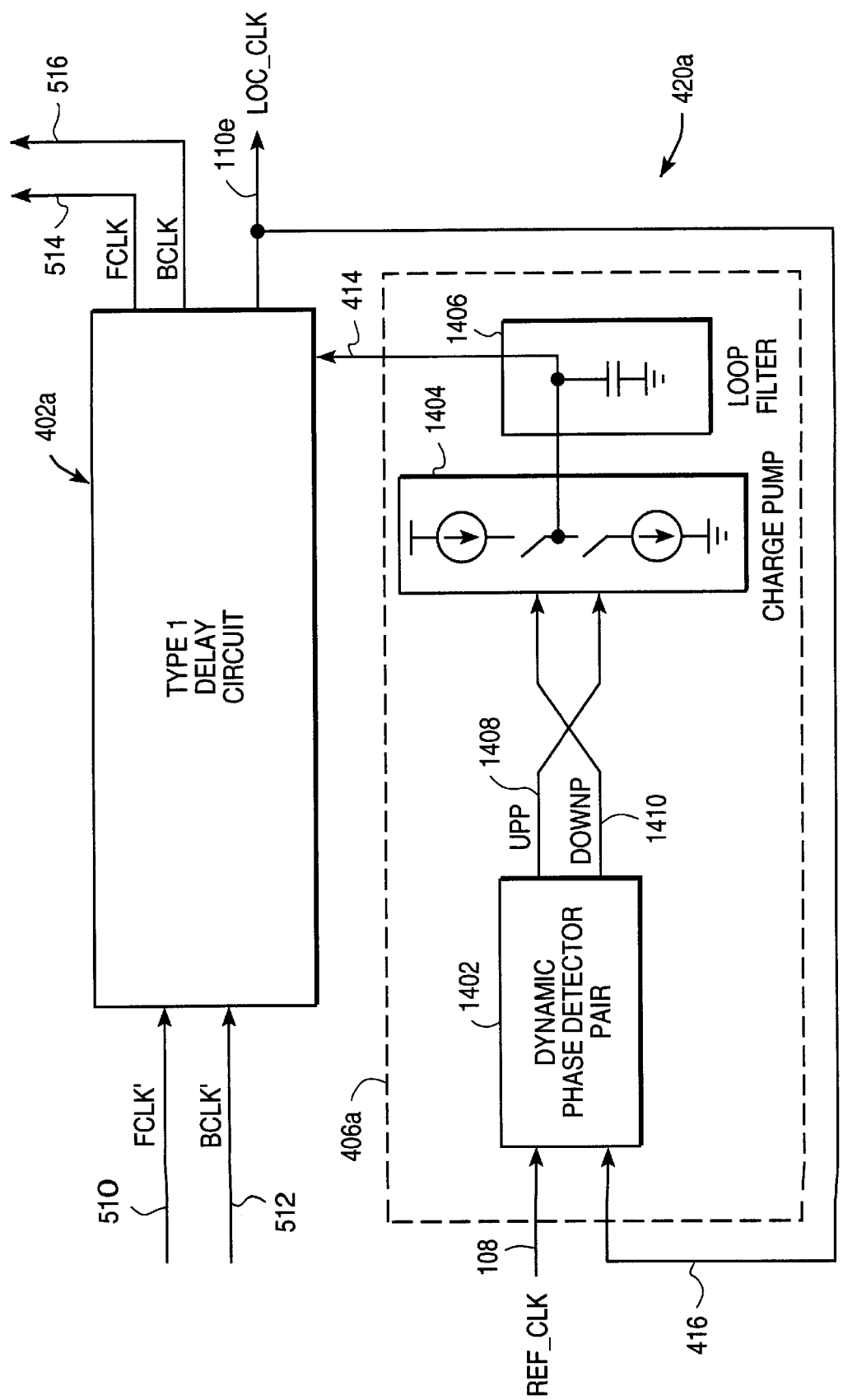
FIG. 14 is a block diagram of one embodiment of the phase acquisition loop 420 of FIG. 5, in accordance with the method of FIG. 13A.

FIG. 14 is a block diagram of one embodiment of the phase acquisition loop 420 of FIG. 5, in accordance with the method of FIG. 13A. That is, FIG. 14 is an embodiment of the phase acquisition loop 420 of FIG. 5 which implements the Type 1 approach. As in FIG. 5, the phase acquisition loop 420A includes a delay circuit 402A, which will be referred to as a Type 1 delay circuit 402A, and a delay controller 406A. The delay controller 406A includes a dynamic phase detector pair 1402, a charge pump 1404, and a loop filter 1406. The phase acquisition loop 420A is coupled as follows. The Type 1 delay circuit 402A is coupled to receive the F- and B-clocks from the frequency acquisition loop 418 on lines 510 and 512 and also coupled to send the feedback F- and B-clocks to the frequency acquisition loop 418 on lines 514 and 516. The Type 1 delay circuit 402A is also adapted to output the local clock on line 110E. The dynamic phase detector pair 1402 is coupled to receive the local clock on line 416 and is also adapted to receive the reference clock on line 108. The dynamic phase detector pair 1402 is coupled to send UPP and DOWNP signals, which are lead/lag signals, to the charge pump 1404 on lines 1408 and 1410, respectively. The charge pump 1404 is then coupled to send a delay control signal on line 414 to the Type 1 delay circuit 402A via the loop filter 1406.

Figure 15:
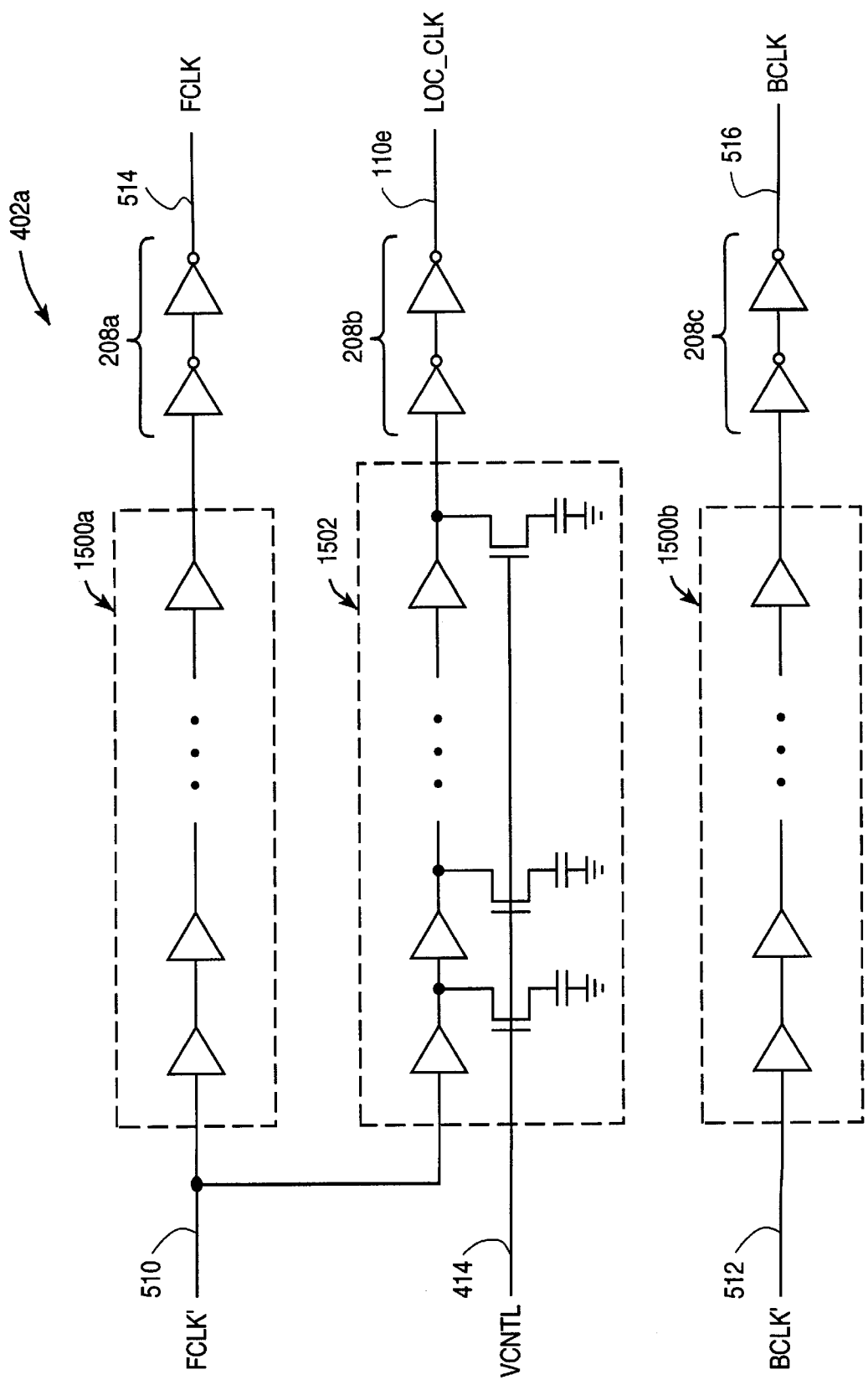
FIG. 15 is a circuit diagram of a preferred embodiment of the Type 1 delay circuit 402A of FIG. 14.

FIG. 15 is a circuit diagram of a preferred embodiment of the Type 1 delay circuit 402A of FIG. 14. The Type 1 delay circuit 402A includes three delay chains 1500A, 1500B, and 1502, and three sets of processing circuitry 208A, 208B, and 208C. Each of the delay chains 1500A, 1500B, and 1502 is coupled in series with one of the processing circuitries 208A–208C to form a signal path. More specifically, the delay chain 1500A is coupled to receive the F-clock on line 510. The output of the delay chain 1500A is then coupled to the input of processing circuitry 208A, which produces the feedback F-clock on line 514. Similarly, the B-clock on line 512 is received by the delay chain 1500B, which is coupled to processing circuitry 208C, which produces the feedback B-clock on line 516. Likewise, the F-clock on line 510 is also coupled to the delay chain 1502, which is coupled to the processing circuitry 208B, which produces the local clock on its output line 110E. Delay chains 1500A and 1500B introduce fixed delays; while the delay period introduced by delay chain 1502 may be adjusted by the delay control signal received on line 414. The processing circuits 208A and 208C are used to duplicate the delay introduced by circuit 208B. Hence, circuits 208A and 208C may be identical to circuit 208B or they may simply be circuits which introduce equivalent delays.

Figure 16:
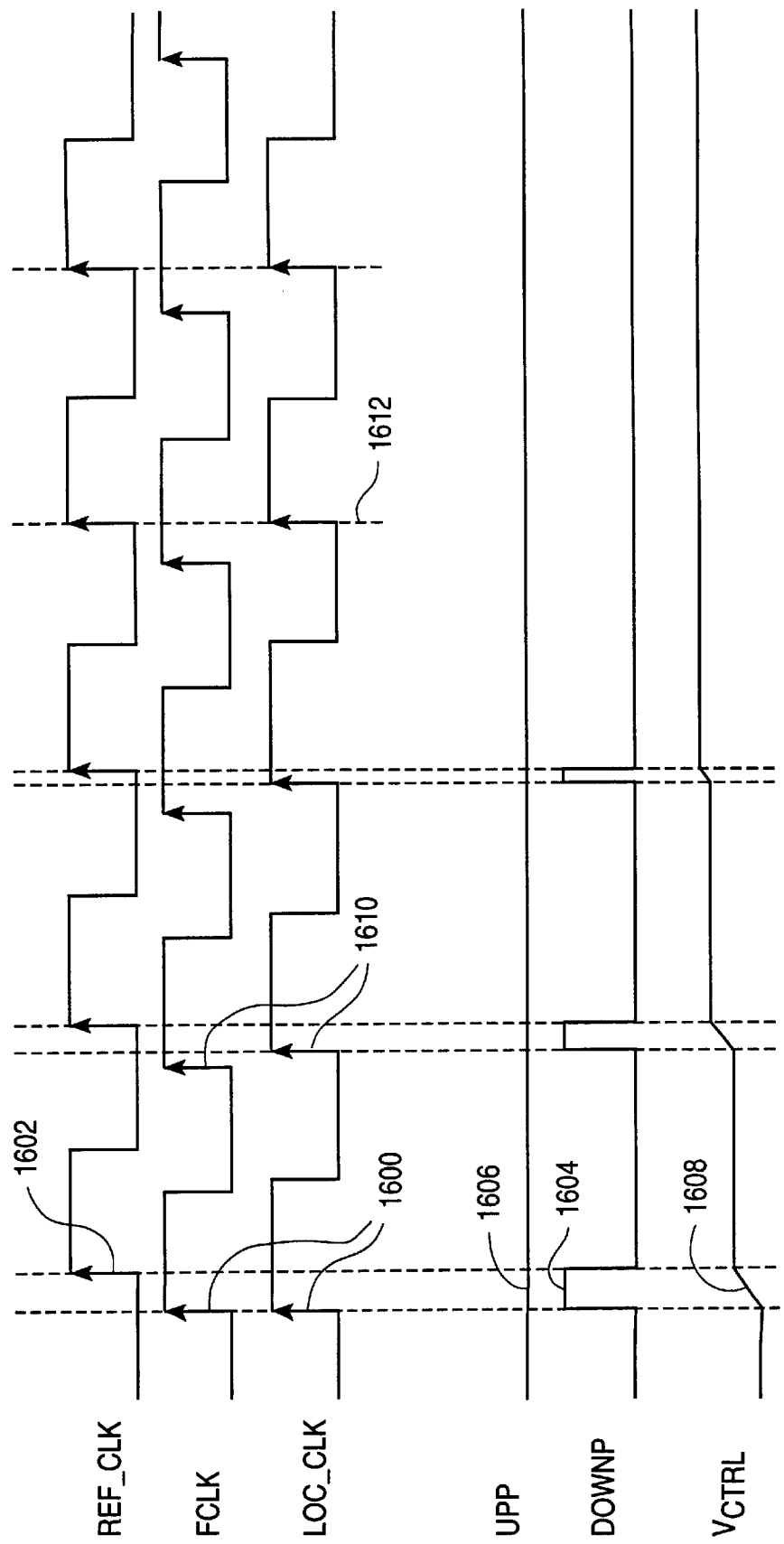
FIG. 16 is a timing diagram illustrating the operation of the phase acquisition loop 420A of FIG. 14.

FIG. 16 is a timing diagram illustrating the operation of the phase acquisition loop 420A of FIG. 14. In this example timing diagram, the feedback F-clock and local clock initially begin synchronized 1600 with each other but leading 1602 the reference clock. The dynamic phase detector pair 1402 compares the reference clock and local clock and asserts 1604 DOWNP for the period when the local clock leads the reference clock. The simultaneous assertion 1604 of DOWNP and nonassertion 1606 of UPP connects the loop filter 1406 to the current source of the charge pump 1404. In other words, the charge pump 1404 charges the loop filter 1406 during the period when DOWNP is asserted. Charging the loop filter 1406 increases 1608 the delay control signal on line 414. This, in turn, increases the delay experienced by the local clock, delaying 1610 it with respect to the feedback F-clock. This process continues until the local clock and reference clock are synchronized 1612. If the local clock lagged the reference clock, then UPP would be asserted, the delay control signal on line 414 would be reduced, and the delay experienced by the local clock would also be reduced, thus synchronizing the reference and local clocks.

Figure 17:
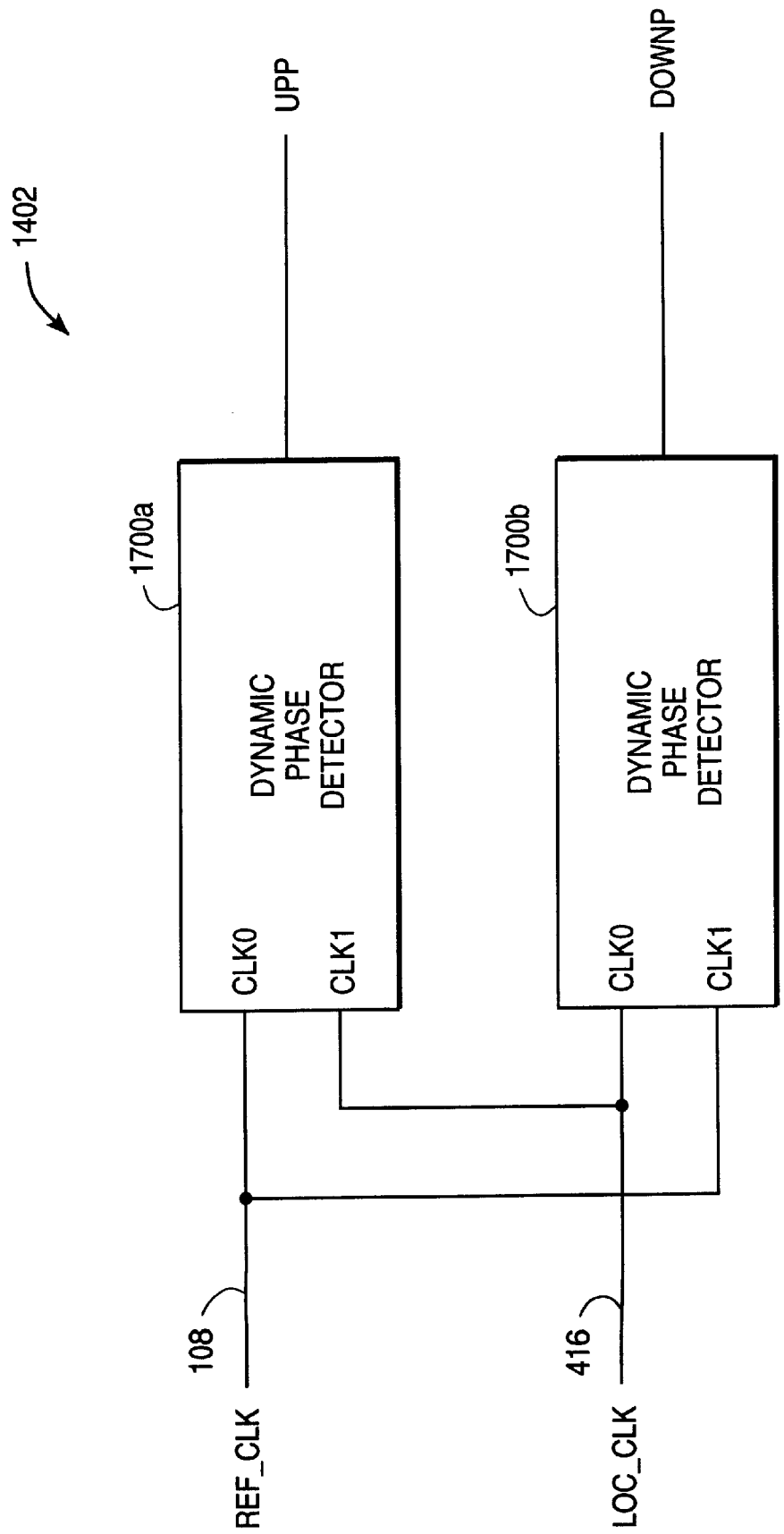
FIG. 17 is a block diagram of a preferred embodiment of the dynamic phase detector pair 1402 of FIG. 14.

FIG. 17 is a block diagram of a preferred embodiment of the dynamic phase detector pair 1402 of FIG. 14. The dynamic phase detector pair 1402 includes a pair of dynamic phase detectors 1700A and 1700B. Each dynamic phase detector 1700–1700B includes CLK0 and CLK1 inputs and an output. Dynamic phase detector 1700A is coupled to receive the reference clock at its CLK0 input, the local clock at its CLK1 input, and to output UPP. Dynamic phase detector 1700B is coupled to receive the local clock at its CLK1 input, the reference clock at its CLK1 input, and to output DOWNP.

The dynamic phase detectors 1700A–1700B assert their outputs for the period when the CLK0 input leads the CLK1 input. A preferred embodiment of the dynamic phase detectors 1700A–1700B are disclosed in co-pending patent application Ser. No. 08/631,420, "High-speed and high-precision phase-locked loop" by Kyeongho Lee and Deog-Kyoon Jeong, the teachings of which are incorporated herein by reference. Specifically, the up signal generator 604 and down signal generator 606 in FIG. 6 of patent application Ser. No. 08/631,420 are preferred embodiments of the dynamic phase detectors 1700A and 1700B.

Figure 18:
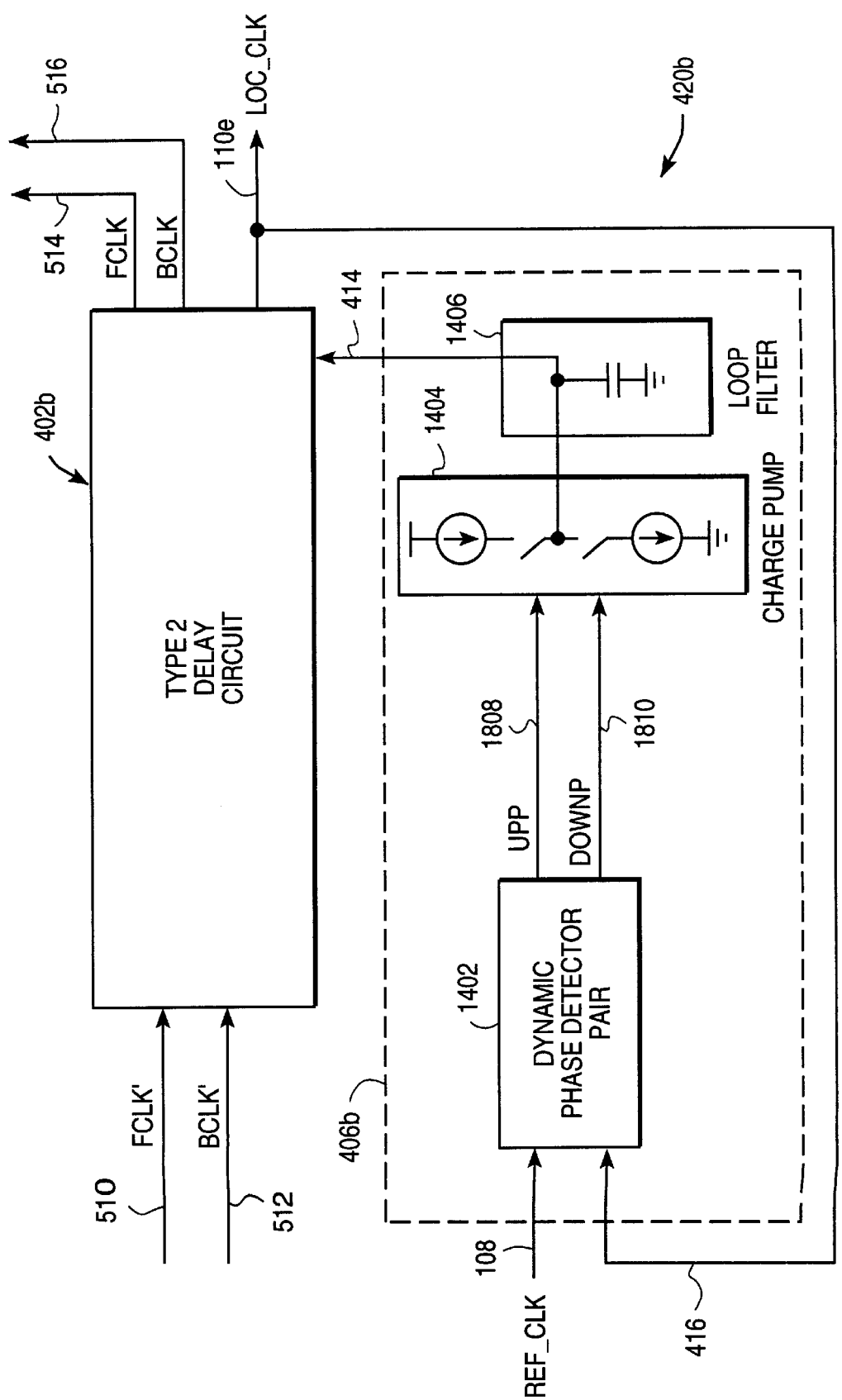
FIG. 18 is a block diagram of a second embodiment of the phase acquisition loop 420 of FIG. 5, in accordance with the method of FIG. 13B.

FIG. 18 is a block diagram of one embodiment of the phase acquisition loop 420 of FIG. 5, in accordance with the method of FIG. 13B. That is, FIG. 18 is an embodiment of the phase acquisition loop 420 of FIG. 5 which implements the Type 2 approach. The phase acquisition loop 420B includes a Type 2 delay circuit 402B and a delay controller 406B. The delay controller 406B includes a dynamic phase detector pair 1402, a charge pump 1404, and a loop filter 1406.

The Type 2 delay circuit 402B is coupled to receive the F- and B-clocks from the frequency acquisition loop 418 on lines 510 and 512 and also coupled to send the feedback F- and B-clocks to the frequency acquisition loop 418 on lines 514 and 516. The Type 2 delay circuit 402B is also adapted to output the local clock on line 110E. The dynamic phase detector pair 1402, charge pump 1404, and loop filter 1406 are coupled as in FIG. 14 with the following exceptions. First, the delay control signal on line 414 is sent to the Type 2 delay circuit 402B rather than the Type 1 delay circuit 402A. Second, the connections between the dynamic phase detector pair 1402 and charge pump 1404 are reversed. In FIG. 14, assertion of UPP on line 1408 connected the loop filter 1406 with the current sink of the charge pump 1404. In FIG. 18, assertion of DOWNP on line 1810 achieves the same purpose. An analogous statement holds for DOWNP in FIG. 14 and UPP in FIG. 18.

Figure 19:
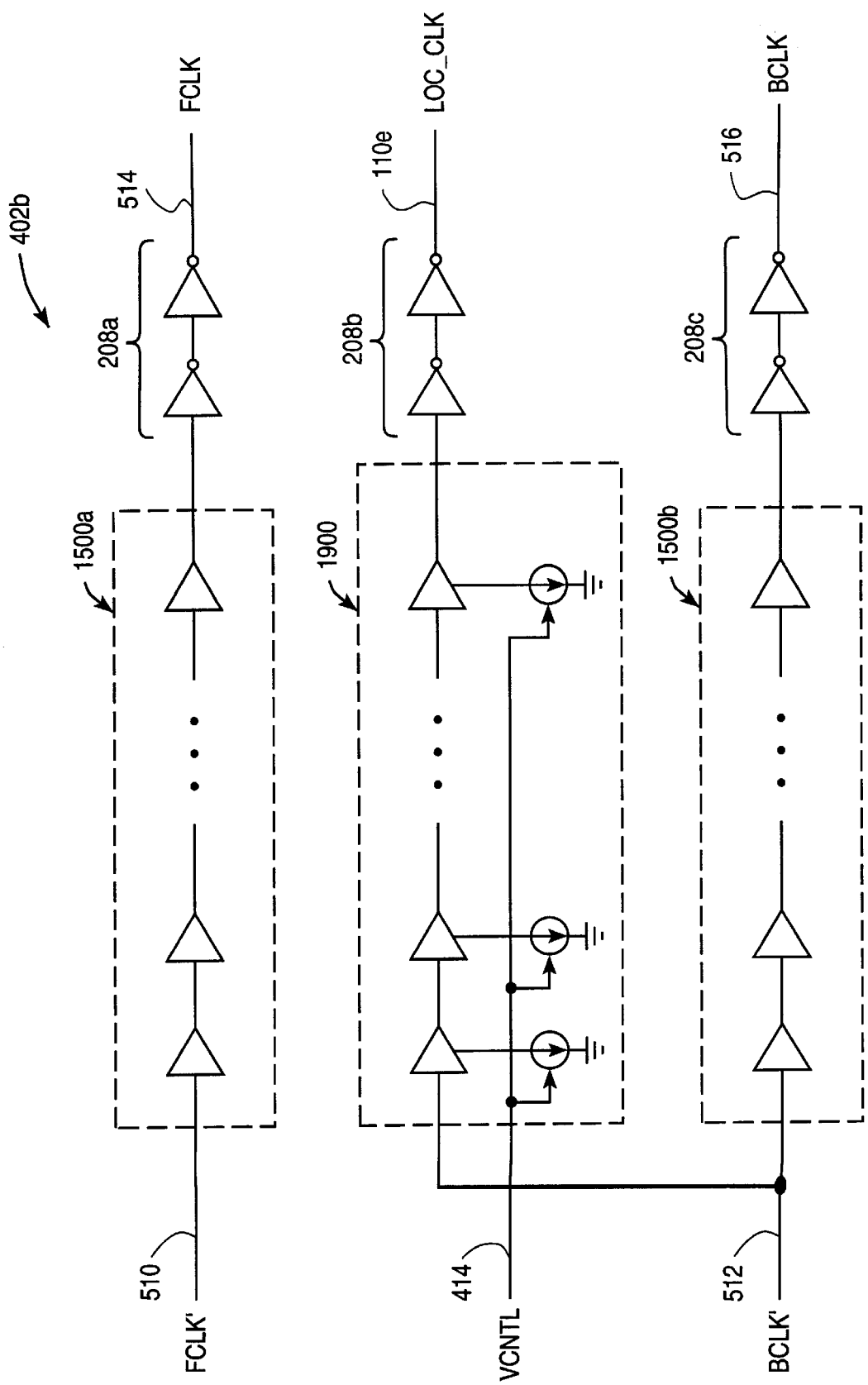
FIG. 19 is a circuit diagram of a preferred embodiment of the Type 2 delay circuit 402B of FIG. 18.

FIG. 19 is a circuit diagram of a preferred embodiment of the Type 2 delay circuit 402B of FIG. 18. The Type 2 delay circuit 402B includes three delay chains 1500A, 1500B, and 1900, and three sets of processing circuitry 208A, 208B, and 208C. The delay chains 1500A and 1500B, and the processing circuitries 208A and 208C are coupled as in FIG. 15. The delay chain 1900 is coupled to receive the B-clock on line 512. The output of the delay chain 1900 is then coupled to the input of processing circuitry 208B, which produces the local clock at its output on line 110E. Delay chains 1500A and 1500B introduce fixed delays; while the delay introduced by delay chain 1900 may be adjusted by the delay control signal received on 414.

Figure 20:
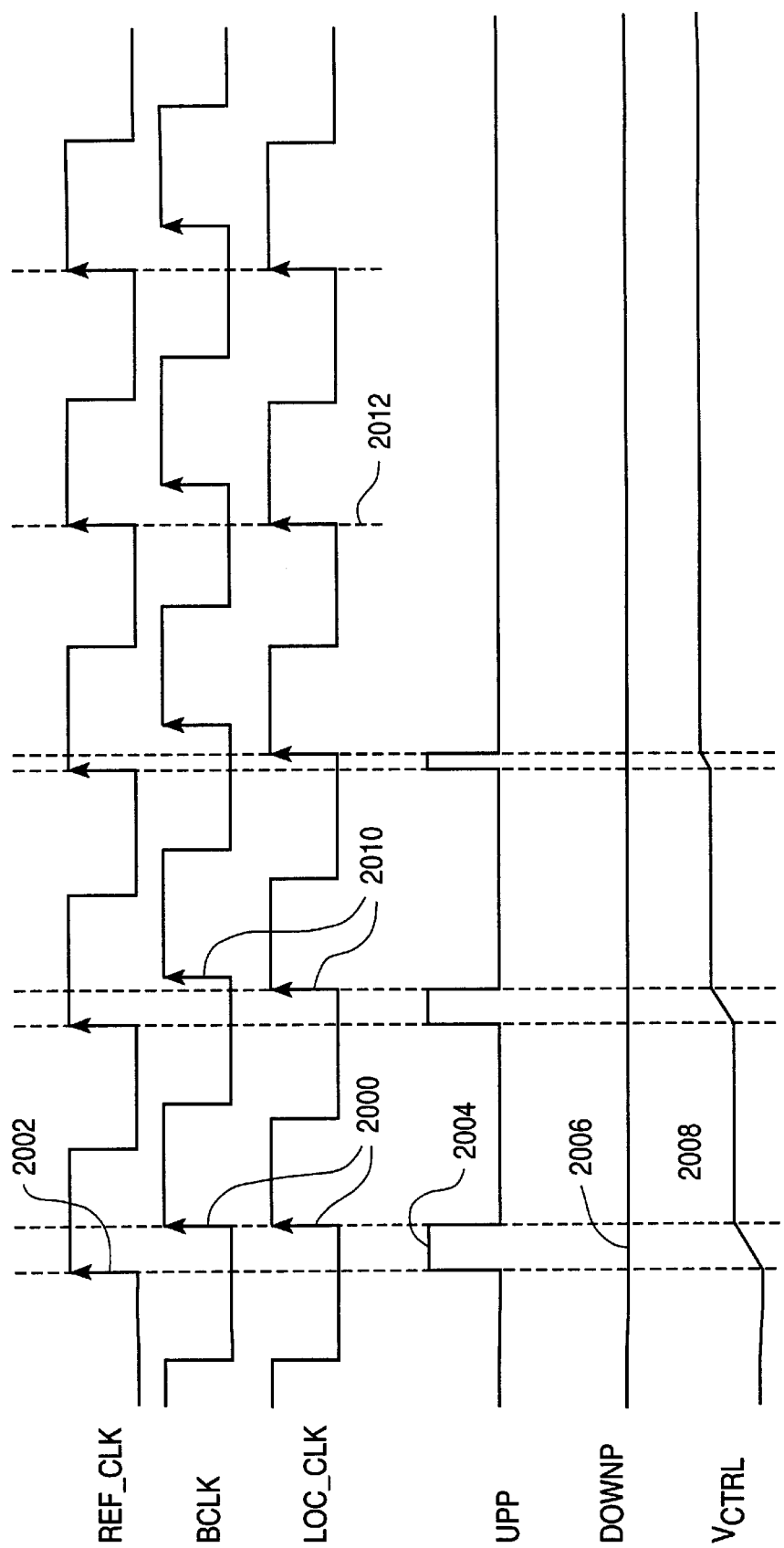
FIG. 20 is a timing diagram illustrating the operation of the phase acquisition loop 420B of FIG. 18.

FIG. 20 is a timing diagram, analogous to the timing diagram of FIG. 16, illustrating the operation of the phase acquisition loop 420B of FIG. 18. The feedback B-clock and local clock initially begin synchronized 2000 with each other but lagging 2007 the reference clock. The dynamic phase detector pair 1402 compares the reference clock and local clock and asserts 2004 UPP for the period when the local clock lags the reference clock. The simultaneous assertion 2004 of UPP and nonassertion 2006 of DOWNP connects the loop filter 1406 to the current source of the charge pump 1404. Charging the loop filter 1406 then increases 2008 the delay control signal on 414, which decreases the delay experienced by the local clock, advancing 2010 with respect to the feedback F-clock. This process continues until the local clock and reference clock are synchronized 2012.

Figure 21:
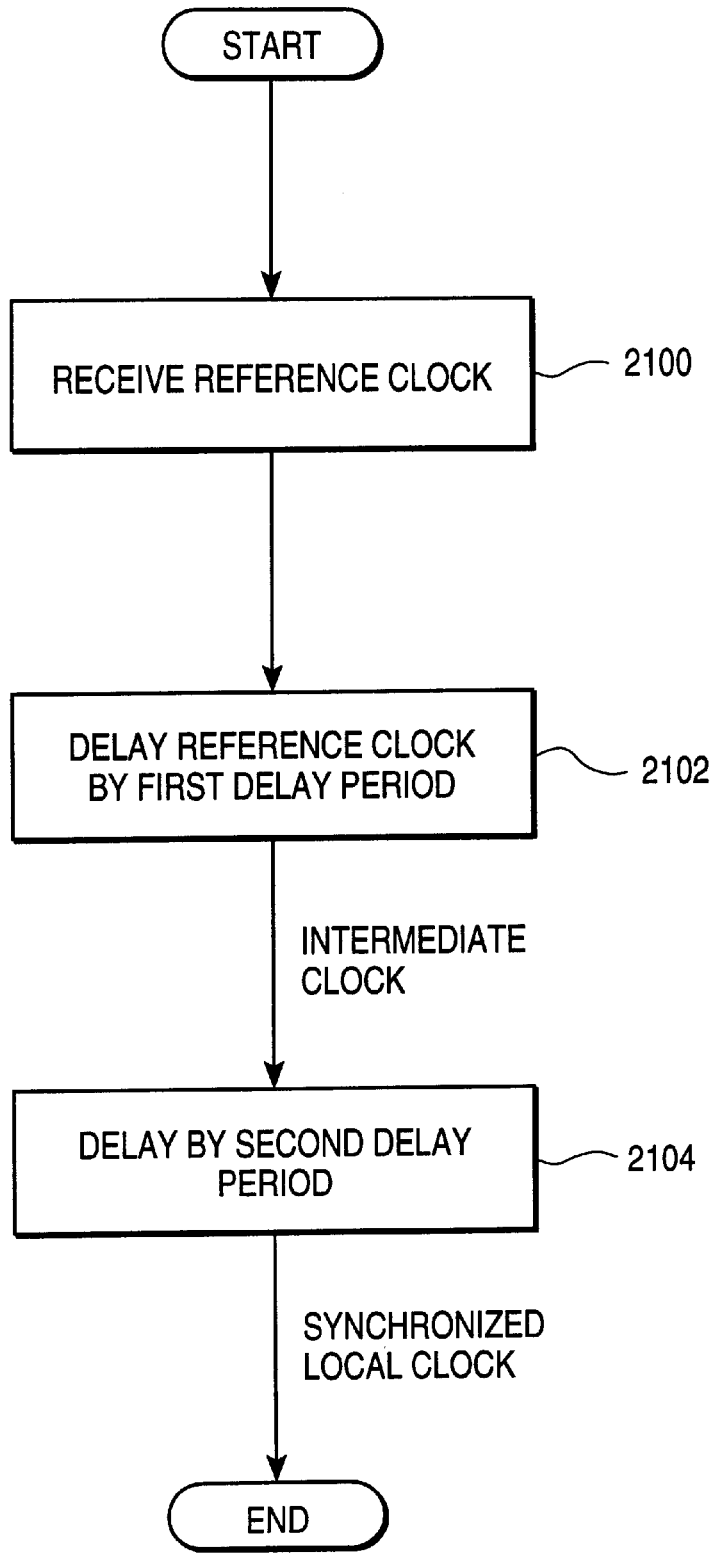
FIG. 21 is a flow diagram illustrating a method for producing a local clock synchronized with a reference clock in accordance with the present invention.

FIG. 21 is a flow diagram illustrating a method for producing a local clock synchronized with a reference clock in accordance with the present invention. The method will be explained with reference to the previously described preferred embodiment, although the method may be practiced using other devices. Referring to FIGS. 4 and 21, a reference clock is received 2100 by the DLDLL 106E on line 108. The delay circuit 400 then delays 2102 the reference clock by a first delay period to produce the intermediate clock on line 408. The delay circuit 402 then delays 2104 the intermediate clock by a second delay period to produce the synchronized local clock on line 110E. In a preferred embodiment, the local clock is delayed by a single clock period with respect to the reference clock.

Figure 22:
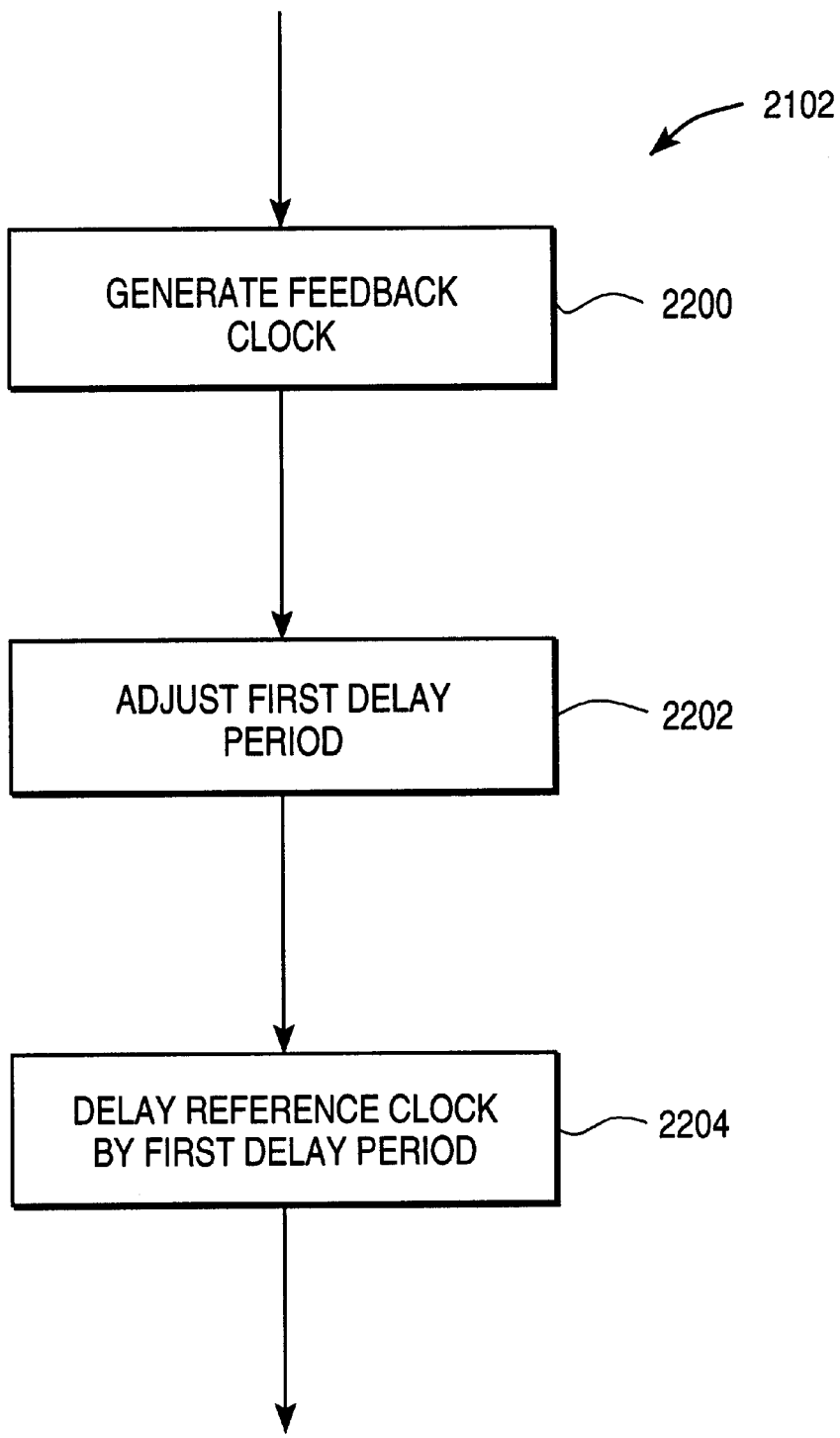
FIG. 22 is a flow diagram illustrating a preferred embodiment of step 2102 from FIG. 21 of delaying a clock by a first delay period.

FIG. 22 is a flow diagram illustrating a preferred embodiment of step 2102 from FIG. 21 of delaying the reference clock by a first delay period. Referring again to FIG. 4, the frequency acquisition loop 418 generates 2200 a feedback clock on line 412 based on the intermediate clock on 408. The delay controller of 404 receives the feedback clock and adjusts 2202 the first delay period introduced by delay circuit 400, based on the relative phase between the feedback clock on line 412 and the reference clock on line 108. The delay circuit 400 then delays 2204 the incoming reference clock on line 108 by the amount of the first delay period.

Figure 23:
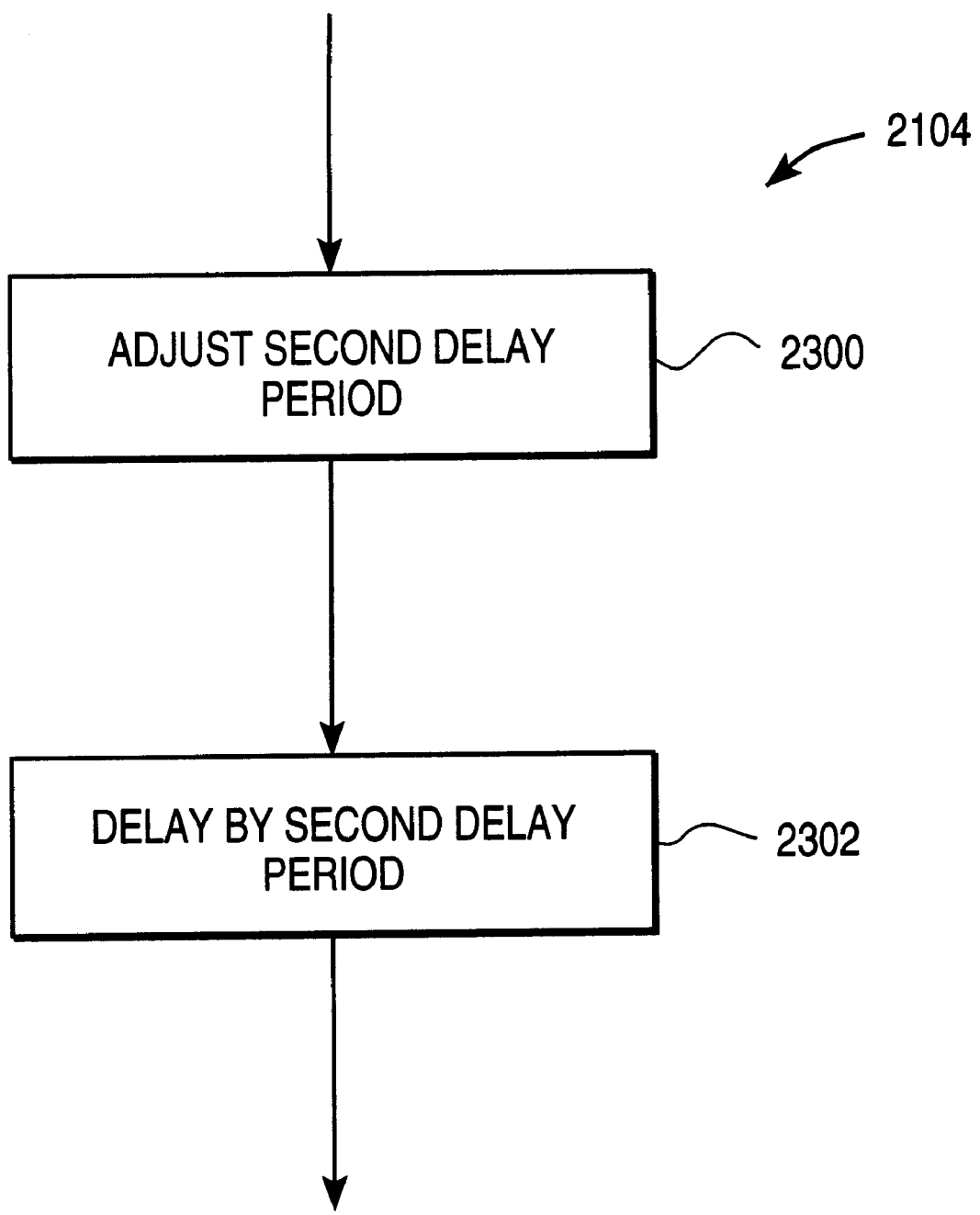
FIG. 23 is a flow diagram illustrating a preferred embodiment of the step 2104 from FIG. 21 of delaying a clock by a second delay period.

FIG. 23 is a flow diagram illustrating a preferred embodiment of the step 2104 from FIG. 21 of delaying the intermediate clock by the second delay period. Referring again to FIG. 4, the delay controller 406 adjusts 2300 the second delay period based on the relative phase between the outgoing local clock on line 110E and the received reference clock on line 108. The delay circuit 402 then delays 2302 the intermediate clock by the amount of the second delay period to produce the outgoing local clock on line 110E.

FIGS. 21–23 provide a broad illustration of a method for producing a local clock synchronized with a reference clock. Further details of a preferred embodiment of this method for use with the DLDLL 106E described previously are contained in the prior text and figures.

Although the invention has been described in considerable detail with reference to certain preferred embodiments thereof, other embodiments are possible. For example, the invention can be incorporated into an integrated circuit on a semiconductor device using techniques known in the art. Therefore, the spirit and scope of the appended claims should not be limited to the description of the preferred embodiments contained herein.

What is claimed is:

1. A delay-locked loop for producing a local clock synchronized to a reference clock, the delay-locked loop comprising:

a frequency acquisition loop adapted to receive a reference clock and coupled to receive first and second feedback clocks, for delaying the reference clock by first and second adjustable delay periods to produce first and second intermediate clocks, wherein the first and second adjustable delay periods are adjusted to place a reference edge of the reference clock between a corresponding reference edge of the first feedback clock and a corresponding reference edge of the second feedback clock; and a phase acquisition loop adapted to receive the reference clock and coupled to receive the first and second intermediate clocks from the frequency acquisition loop, for delaying one of the intermediate clocks by a third adjustable delay period to produce a local clock synchronized to the reference clock and further for delaying each of the intermediate clocks by a fourth delay period to produce the first and second feedback clocks.

2. The delay-locked loop of claim 1 wherein the frequency acquisition loop comprises:

a delay circuit adapted to receive the reference clock, for delaying the reference clock by the first and second adjustable delay periods to produce the first and second intermediate clocks, the first and second adjustable delay periods adjusted by a delay control signal; and a delay controller adapted to receive the reference clock, coupled to receive the first and second feedback clocks from the phase acquisition loop, and coupled to send the delay control signal to the delay circuit, for generating the delay control signal in response to a relative phase between the reference clock and the first and second feedback clocks.

3. The delay-locked loop of claim 2 wherein:

the first and second adjustable delay periods are selected from a plurality of nonadjustable delay periods.

4. The delay-locked loop of claim 3 wherein the delay circuit comprises:

a delay chain adapted to receive the reference clock, for delaying the reference clock by each of the plurality of non-adjustable delay periods to produce a plurality of delayed reference clocks; and a clock selector coupled to receive the plurality of delayed reference clocks and the delay control signal, for selecting two of the plurality of delayed reference clocks in response to the delay control signal to produce the first and second intermediate clocks.

5. The delay-locked loop of claim 4 wherein the delay chain comprises:

a plurality of delay cells connected in series, a first delay cell adapted to receive the reference clock, each delay cell introducing an identical, fixed delay to produce one of the plurality of delayed reference clocks.

6. The delay-locked loop of claim 5 wherein the plurality of delay cells comprises seventeen delay cells.

7. The delay-locked loop of claim 2 wherein the delay controller comprises:

a phase detector adapted to receive the reference clock and coupled to receive the first and second feedback clocks from the phase acquisition loop, for generating a lead/lag signal in response to relative phases between the feedback clocks and the reference clock; and a control logic coupled to receive the lead/lag signal from the phase detector, for generating the delay control signal in response to the lead/lag signal.

8. The delay-locked loop of claim 7 wherein the lead/lag signal comprises an up tick a and a down tick signal;

the phase detector is for asserting the up tick signal when the reference clock is leading both feedback clocks and asserting the down tick signal when the reference clock is lagging both feedback clocks; and the control logic comprises a finite state machine coupled to receive the up tick and down tick signals, for modifying a state of the finite state machine in response thereto, wherein the control logic generates the delay control signal in response to the state.

9. The delay-locked loop of claim 8 wherein the phase detector comprises:

a first cross sensing phase detector adapted to receive the reference clock and the first feedback clock, for asserting a first up signal when the reference clock is leading the first feedback clock and further for asserting a first down signal when the reference clock is lagging the first feedback clock;

a second cross sensing phase detector adapted to receive the reference clock and the second feedback clock, for asserting a second up signal when the reference clock is leading the second feedback clock and further for asserting a second down signal when the reference clock is lagging the second feedback clock; and a combinational logic circuit coupled to receive the first and second up and down signals, for generating the up tick and down tick signals in response thereto.

10. The delay-locked loop of claim 1 wherein the phase acquisition loop comprises:

a delay circuit adapted to receive the intermediate clocks, for delaying one of the intermediate clocks by the third adjustable delay period to produce the local clock, the adjustable delay period adjusted by a delay control signal; and a delay controller adapted to receive the reference clock and coupled to receive the local clock, and coupled to send the delay control signal to the delay circuit, for generating the delay control signal in response to a relative phase between the reference clock and the local clock.

11. The delay-locked loop of claim 10 wherein the first intermediate clock leads the second intermediate clock;

the delay circuit is further for delaying the first intermediate clock by the third adjustable delay period to produce the local clock; and the third adjustable delay period is longer than the fourth delay period.

12. The delay-locked loop of claim 10 wherein:

the first intermediate clock leads the second intermediate clock;

the delay circuit is further for delaying the second intermediate clock by the third adjustable delay period to produce the local clock: and the third adjustable delay period is shorter than the fourth delay period.

13. The delay-locked loop of claim 10 wherein the delay controller comprises:

a phase detector adapted to receive the reference clock and the local clock, for generating a lead/lag signal in response to a relative phase between the local clock and the reference clock; and a charge pump and loop filter connected in series, the charge pump coupled to receive the lead/lag signal from the phase detector, the loop filter coupled to send the delay control signal to the delay circuit, for generating the delay control signal in response to the lead/lag signal.

14. A delay-locked loop for producing a local clock synchronized to a reference clock, the delay-locked loop comprising:

a first delay circuit adapted to receive a reference clock, for delaying the reference clock by first and second adjustable delay periods to produce first and second intermediate clocks each having a same frequency as the reference clock, the first and second adjustable delay periods adjusted by a first delay control signal;

a second delay circuit coupled to receive the first and second intermediate clocks from the first delay circuit, the second delay circuit for delaying one of the intermediate clocks by a third adjustable delay period to produce a local clock synchronized to the reference clock, the third adjustable delay period adjusted by a second delay control signal, the second delay circuit further for delaying each of the intermediate clocks by a fourth delay period to produce first and second feedback clocks;

a first delay controller adapted to receive the reference clock and coupled to receive the first and second feedback clocks, and coupled to send the first delay control signal to the first delay circuit, for generating the first delay control signal wherein the first delay control signal adjusts the first and second adjustable delay periods to place a reference edge of the reference clock between a corresponding reference edge of the first feedback clock and a corresponding reference edge of the second feedback clock; and a second delay controller adapted to receive the reference clock and coupled to receive the local clock, and coupled to send the second delay control signal to the second delay circuit, for generating the second delay control signal in response to a relative phase between the reference clock and the local clock.

15. The delay-locked loop of claim 14 wherein the first and second adjustable delay periods are selected from a plurality of predetermined delay periods in response to the first delay control signal.

16. A method for producing a local clock synchronized to a reference clock comprising the steps of:

receiving a reference clock;

delaying the reference clock by first and second adjustable delay periods to produce first and second intermediate clocks;

delaying one of the intermediate clocks by a third adjustable delay period to produce a local clock synchronized to the reference clock;

delaying each of the intermediate clocks by a fourth delay period to produce first and second feedback clocks; and adjusting the first and second adjustable delay periods to place a reference edge of the reference clock between a corresponding reference edge of the first feedback clock and a corresponding reference edge of the second feedback clock.

17. The method of claim 16 wherein adjusting: the first and second adjustable delay periods comprises the steps of:
   determining a relative phase between the reference clock and the feedback clocks; and
   adjusting the first and second adjustable delay periods in response to the relative phase between the reference clock and the feedback clocks.

18. The method of claim 17 wherein adjusting the first and second adjustable delay periods comprises the step of:
   selecting one of a plurality of non-adjustable delay periods in response to the relative phase between the reference clock and the feedback clocks.

19. The method of claim 18 wherein selecting one of the non-adjustable delay periods comprises the steps of:
   delaying the reference clock by each of the non-adjustable delay periods to produce a plurality of delayed reference clocks; and
   selecting two of the plurality of delayed reference clocks.

20. The method of claim 18 wherein selecting one of the non-adjustable delay periods comprises the steps of:
   generating an input to a finite state machine in response to a relative phase between the reference clock and the feedback clocks;
   updating a state of the finite state machine in response to the input; and
   selecting one of the non-adjustable delay periods in response to the state.

21. The method of claim 20 wherein:
   generating the input to the finite state machine comprises the steps of
      comparing a phase of the reference clock and a phase of the first feedback clock to generate a first up signal and a first down signal,
      comparing a phase of the reference clock and a phase of the second feedback clock to generate a second up signal and a second down signal, and
      logically combining the first and second up and down signals to produce the input to the finite state machine.

22. The method of claim 20 wherein:
   the input to the finite state machine is selected from a group comprising up, down, and hold;
   the states are ordered in increasing order of the non-adjustable delay period selected in response to the state; and
   updating the state of the finite state machine comprises the steps of remaining in the same state if the input is hold, incrementing the state if the input is down, and decrementing the state if the input is up.

23. The method of claim 16 wherein delaying one of the intermediate clocks comprises the step of:
   adjusting the third adjustable delay period to minimize a phase difference between the reference clock and the local clock.

24. The method of claim 23 wherein adjusting the third adjustable delay period comprises the steps of:
   comparing a phase of the local clock with a phase of the reference clock to produce a lead/lag signal;
   charging a loop filter in response to the lead/lag signal to produce a delay control signal; and
   adjusting the second adjustable delay period in response to the delay control signal.

25. The method of claim 23 wherein:
   the first intermediate clock leads the second intermediate clock;
   delaying one of the intermediate clocks by the third adjustable delay period comprises delaying the first intermediate clocks by the third adjustable delay period; and
   the third adjustable delay period is longer than the fourth delay period.

26. The method of claim 23 wherein:
   the first intermediate clock leads the second intermediate clock;
   delaying one of the intermediate clocks by the third adjustable delay period comprises delaying the second intermediate clocks by the third adjustable delay period; and
   the third adjustable delay period is shorter than the fourth delay period.

* * * * *

UNITED STATES PATENT AND TRADEMARK OFFICE
CERTIFICATE OF CORRECTION

PATENT NO. : 5,969,552

DATED : October 19, 1999

INVENTOR(S) : Kyeongho Lee, Yongsam Moon, Deog-Kyoon Jeong

It is certified that error appears in the above-identified patent and that said Letters Patent is hereby corrected as shown below:

Title page, at the end of section [56], column 2, please add:

OTHER DOCUMENTS

Coleman, Charles H., "A New Technique for Time-Base Stabilization of Video Recorders", IEEE Transactions on Broadcasting, Vol. BC-17, No. 1, March 1971, pp. 29-36

Maneatis, John G., "Low-Jitter and Process-Independent DLL and PLL Based on Self-Biased Techniques", IEEE International Solid State Circuits Conference, Vol. 39, February 1996, page 130-131, 430

Tanoi, et al., "A 250-622 MHz Deskew and Jitter-Suppressed Clock Buffer Using Two-Loop Architecture", IEICE Transactions on Electronics, Vol. E79-C, No. 7, July 1996, pp. 898-904

Signed and Sealed this

Sixteenth Day of May, 2000

*Attest:*

Q. TODD DICKINSON

*Attesting Officer*   *Director of Patents and Trademarks*